United States Patent
Yano et al.

(10) Patent No.: US 10,644,163 B2
(45) Date of Patent: May 5, 2020

(54) SEMICONDUCTOR FILM COMPRISING AN OXIDE CONTAINING IN ATOMS, SN ATOMS AND ZN ATOMS

(75) Inventors: Koki Yano, Chiba (JP); Hirokazu Kawashima, Chiba (JP); Kazuyoshi Inoue, Chiba (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 141 days.

(21) Appl. No.: 13/060,699

(22) PCT Filed: Aug. 26, 2009

(86) PCT No.: PCT/JP2009/004113
§ 371 (c)(1),
(2), (4) Date: Jun. 23, 2011

(87) PCT Pub. No.: WO2010/023889
PCT Pub. Date: Mar. 4, 2010

(65) Prior Publication Data
US 2011/0240988 A1 Oct. 6, 2011

(30) Foreign Application Priority Data

Aug. 27, 2008 (JP) .................. 2008-218054

(51) Int. Cl.
*H01L 29/786* (2006.01)
*C23C 14/34* (2006.01)
(Continued)

(52) U.S. Cl.
CPC .......... *H01L 29/7869* (2013.01); *C22C 30/04* (2013.01); *C22C 30/06* (2013.01);
(Continued)

(58) Field of Classification Search
CPC .......... H01L 29/7869; H01L 29/66969; H01L 27/1225; H01L 21/02554; H01L 29/78693; H01L 21/02565
(Continued)

(56) References Cited

U.S. PATENT DOCUMENTS 7,884,360 B2   2/2011   Takechi et al.
7,906,777 B2   3/2011   Yano et al.
(Continued)

FOREIGN PATENT DOCUMENTS

JP   2006 165531   6/2006
JP   2007 073559   3/2007
(Continued)

OTHER PUBLICATIONS

WO 2007/037191 A1 English Translation.*
(Continued)

*Primary Examiner* — David Chen
(74) *Attorney, Agent, or Firm* — Millen, White, Zelano & Branigan, PC; Ryan Pool

(57) ABSTRACT

A field effect transistor including: a substrate, and at least gate electrode, a gate insulating film, a semiconductor layer, a protective layer for the semiconductor layer, a source electrode and a drain electrode provided on the substrate, wherein the source electrode and the drain electrode are connected with the semiconductor layer therebetween, the gate insulating film is between the gate electrode and the semiconductor layer, the protective layer is on at least one surface of the semiconductor layer, the semiconductor layer includes an oxide containing In atoms, Sn atoms and Zn atoms, the atomic composition ratio of Zn/(In+Sn+Zn) is 25 atom % or more and 75 atom % or less, and the atomic composition ratio of Sn/(In+Sn+Zn) is less than 50 atom %.

5 Claims, 10 Drawing Sheets

(51) Int. Cl.
*C23C 14/16* (2006.01)
*C22C 30/04* (2006.01)
*C22C 30/06* (2006.01)
*H01L 29/66* (2006.01)
*H01L 21/02* (2006.01)
*H01L 27/12* (2006.01)

(52) U.S. Cl.
CPC ........ *C23C 14/165* (2013.01); *C23C 14/3407* (2013.01); *H01L 21/02554* (2013.01); *H01L 21/02565* (2013.01); *H01L 29/66969* (2013.01); *H01L 29/78606* (2013.01); *H01L 29/78609* (2013.01); *H01L 29/78633* (2013.01); *H01L 29/78693* (2013.01); *H01L 27/1225* (2013.01)

(58) Field of Classification Search
USPC .................. 257/43, 52, 57, 59, 72, E21.411, 257/E29.083, E29.092, E29.094, E29.101, 257/E29.296, E31.126; 438/104
See application file for complete search history.

(56) References Cited

U.S. PATENT DOCUMENTS

| | | | |
|---|---|---|---|
| 2003/0184688 A1* | 10/2003 | Kim | G02F 1/13439 349/43 |
| 2005/0199880 A1* | 9/2005 | Hoffman et al. | 257/72 |
| 2006/0110867 A1 | 5/2006 | Yabuta et al. | |
| 2006/0137738 A1* | 6/2006 | Ahn | H01L 31/022466 136/256 |
| 2007/0141784 A1* | 6/2007 | Wager et al. | 438/261 |
| 2007/0194379 A1 | 8/2007 | Hosono et al. | |
| 2008/0024055 A1* | 1/2008 | Marks et al. | 313/504 |
| 2008/0197350 A1 | 8/2008 | Park et al. | |
| 2009/0278122 A1 | 11/2009 | Hosono et al. | |
| 2009/0308635 A1 | 12/2009 | Yano et al. | |
| 2010/0053523 A1* | 3/2010 | Umeno | C01G 15/00 349/122 |
| 2010/0155717 A1* | 6/2010 | Yano | C23C 14/086 257/43 |
| 2011/0141100 A1 | 6/2011 | Park et al. | |
| 2011/0240988 A1 | 10/2011 | Yano et al. | |

FOREIGN PATENT DOCUMENTS

| | | |
|---|---|---|
| JP | 2007-212699 | 8/2007 |
| JP | 2008 042088 | 2/2008 |
| JP | 5189698 B2 | 4/2013 |
| KR | 10-2008-0076608 A | 8/2008 |
| WO | WO-2005 088726 | 9/2005 |
| WO | WO-2007 034733 | 3/2007 |
| WO | WO-2007 037191 | 4/2007 |
| WO | WO-2007 058232 | 5/2007 |

OTHER PUBLICATIONS

Nomura et al., Relationship between non-localized tail states and carrier transport in amporphous oxide semiconductor, In—Ga—Zn—O, Jul. 17, 2008, Wiley, 205, No. 8, 1910-1914.*
Grover, M. S. et al., "Thin-film transistors with transparent amorphous zinc indium tin oxide channel layer," Journal of Physics D: Applied Physics, 2007, pp. 1335-1338, vol. 40.
Idemitsu Kosan Co., "Sputtering target, transparent conductive film and transparent electrode," Retrieved from espacenet database, Publication Date: Mar. 29, 2007; English Abstract of WO-2007 034733.
International Preliminary Report on Patentability for PCT/JP2009/004113 dated Apr. 21, 2011.
International Search Report for PCT/JP2009/004113 dated Oct. 13, 2009.
Kochi Prefecture Sangyo Shinko Center., "Method of manufacturing thin-film transistor," Patent Abstracts of Japan, Publication Date: Mar. 22, 2007; English Abstract of JP-2007 073559.
Saji, K. J. et al., "Optical and carrier transport properties of cosputtered Zn—In—Sn—O films and their applications to TFTs," Journal of Electrochemical Society, 2008, pp. H390-H395, vol. 155, No. 6.
Kazuyoshi, I. et al. "Reflective TFT Substrate and Method for Manufacturing Same", English Abstract of Japanese Publication No. JP2007-212699; Published: Aug. 23, 2007, Application No. 2006-031833, Date of Filing: Feb. 9, 2006. (Patents Abstracts of Japan).
Kazuyoshi, I. et al. "Reflective TFT Substrate and Method for Manufacturing Same", English Abstract of Japanese Publication No. JP2007-212699; Published: Aug. 23, 2007, Application No. 2006-031833; Date of Filing: Feb. 9, 2006. (Thomson Innovation Record Review; 21 pages).
Espacenet Family List of Japanese 2007212699; Published: Aug. 23, 2007. (http://worldwide.espacenet.com; printed Oct. 19, 2012).
Japanese Office Action dated Oct. 9, 2012 in Japanese Patent Application No. 2010-526539. (4 pages).
JP Office Action dated Jan. 21, 2014 issued in corresponding JP 2012-190253 application (pp. 1-7).
Korean Office Action dated Nov. 3, 2014 issued in corresponding KR 10-2011-7004656 application (pp. 1-4).
Office action dated Nov. 3, 2017 in corresponding U.S. Appl. No. 15/075,787.
Chan Woong Na, Seung Yong Bae, andJeunghee Park; Short-Period Superlattice Structure of Sn-Doped $In_2O_3(ZnO)4$ and $In_2O_3(ZnO)5$ Nanowires; J. Phys. Chem. B, 2005, 109 (26), pp. 12785-12790.

* cited by examiner (a)

(b)

(c)

(d)

(e)

(f)

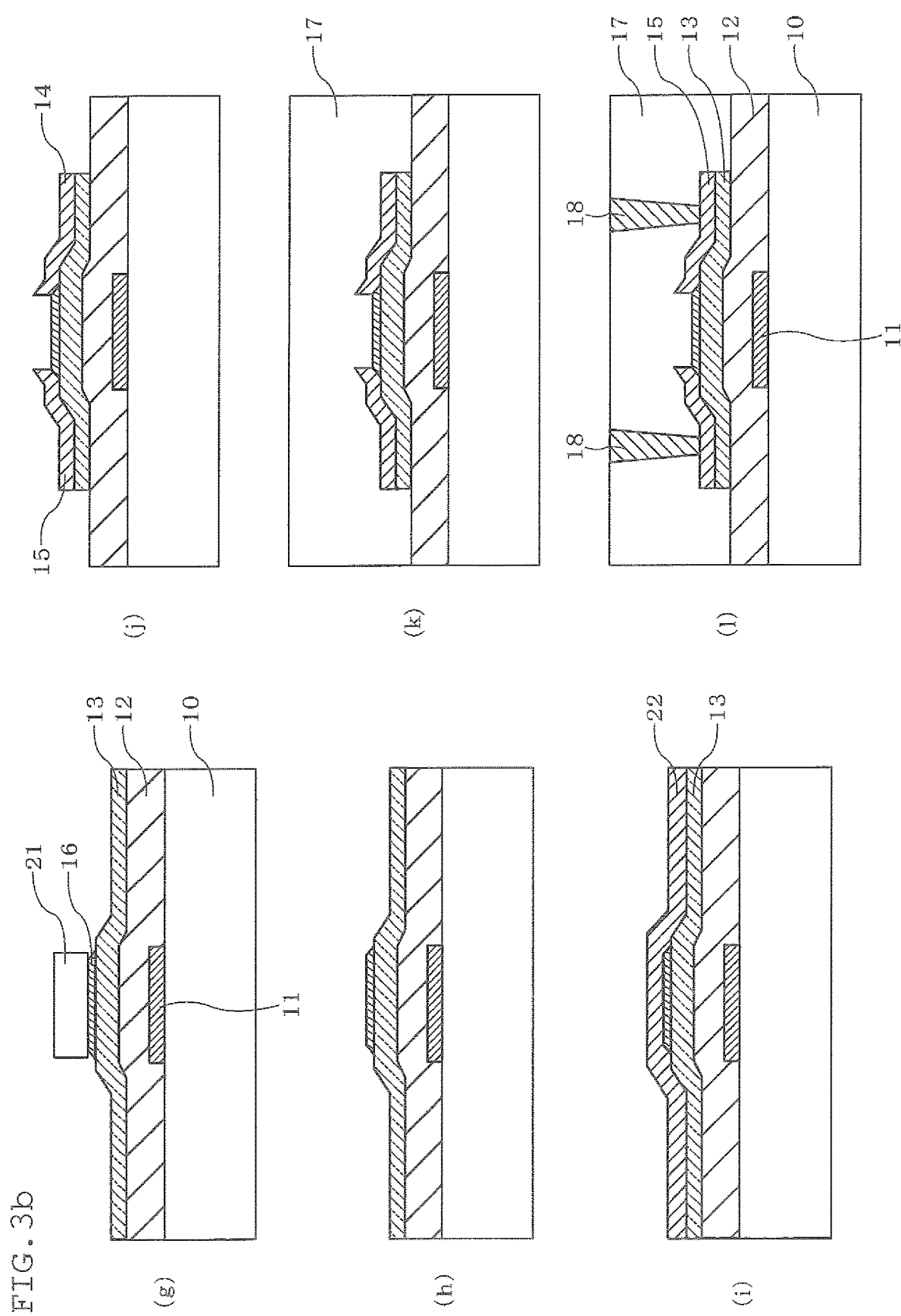

(a)

(b)

SEMICONDUCTOR FILM COMPRISING AN OXIDE CONTAINING IN ATOMS, SN ATOMS AND ZN ATOMS

TECHNICAL FIELD

The invention relates to a field effect transistor, a method for manufacturing the same and a sputtering target.

BACKGROUND ART

A field effect transistor is a device which is widely used as a unit electronic element of a semiconductor memory integrated circuit, a high-frequency signal amplification element, a liquid crystal driving element or the like. It is an electronic device which is most practically used in recent years.

Of these, in particular, with a remarkable progress in displays in recent years, a thin film transistor (TFT) is widely used as a switching device which applies a voltage to a display element to drive a display for liquid crystal displays (LCD), electroluminescence displays (EL) and field emission displays (FED).

As the material of the above-mentioned thin film transistor, a silicon-based semiconductor is widely used. In general, crystalline silicon is used in a high-frequency amplification element, an integrated circuit element or the like, which require high-speed operation. In a liquid crystal driving element or the like, amorphous silicon is used to meet the requirement for an increase in area.

However, crystalline silicon is required to be heated at a high temperature, for example, 800° C. or higher, or by means of an excimer laser for crystallization. Therefore, it is difficult to apply it to a large-area substrate. In addition, there is a problem that a large amount of energy and a large number of steps are required in production. Further, since crystalline silicon is normally restricted to a TFT with a top-gate configuration, a reduction in production cost such as a decrease in number of masks is difficult.

On the other hand, an amorphous silicon semiconductor (amorphous silicon) which can be formed at a relatively low temperature has a small mobility of about 0.5 cm$^2$/Vs, and has a low switching speed as compared with a crystalline silicon-based thin film. Therefore, a problem may arise that a large-area, highly precise and high-frequency animation cannot be displayed. Further, there is a problem that a field effect transistor using amorphous silicon has low stability (reliability) to direct current stress and hence it is difficult to apply it to a self-emission type display element such as an organic EL device which is driven at direct current.

Today, as a switching element for driving a display, a device using a silicon-based semiconductor film constitutes the mainstream due to various excellent performances including improved stability and processability of a silicon thin film and a high switching speed. Such a silicon-based thin film is generally produced by the chemical vapor deposition (CVD) method.

Conventional thin film transistors (TFT) have an inverted-staggered structure in which, on a substrate formed of glass or the like, a gate electrode, a gate-insulating layer, a semiconductor layer such as a hydrogenated amorphous silicon (a-Si:H) film, a source electrode and a drain electrode are sequentially stacked. This inverted-staggered type TFT is used, in a field of large-area devices including an image sensor, as a driving element for flat panel displays represented by active matrix-type liquid crystal displays. However, in these applications, with an improvement in function (corresponding to a large-area, high precise and high-frequency display), a further increase in operation speed is demanded even for thin film transistors.

Under such circumstances, an oxide semiconductor using an oxide has attracted attention as a semiconductor with which improvement in transistor performance (mobility and stability) and an increase in area can be attained simultaneously.

However, of such metal oxide semiconductors, a conventional metal oxide semiconductor using zinc oxide has poor TFT characteristics such as a low mobility, a small on-off ratio, a large amount of current leakage, unclear pinch-off and tendency of becoming normally-on. In addition, due to poor chemicals resistance, metal oxide semiconductors have problems that they are hard to be subjected to wet etching or the like, and hence, the production process or the use environment was restricted.

Furthermore, since it is required to form an oxide semiconductor into a film at a high pressure in order to improve performance, the film-forming speed is slow and a high temperature treatment at 700° C. or higher is required. Moreover, in the case of a semiconductor with a top-gate configuration, many restrictions are imposed for practical use since the film thickness of the oxide semiconductor is required to be 50 nm or more.

In order to solve such a problem, a field effect transistor using an amorphous oxide semiconductor which is composed of indium oxide and zinc oxide or an amorphous oxide semiconductor which is composed of indium oxide, zinc oxide and gallium oxide has been studied. However, if gallium (Ga) is not added, stability to environments such as moisture resistance is lowered, and when the added amount of Ga increased, there is a possibility that the TFT characteristics, such as mobility and S value, may be deteriorated. Moreover, since Ga is a costly rare metal, stable supply thereof is difficult.

Under such circumstances, as an oxide semiconductor which does not contain Ga, a field effect transistor using an amorphous oxide semiconductor which is composed of indium oxide, zinc oxide and tin oxide has been studied (for example, see Patent Document 1).

Although a field effect transistor using tin oxide has been studied for many years, it has not been put in practical use due to a high off current and a low mobility. The reason therefor is considered to be that, in tin oxide, a lower oxide (SnO or the like), which is an insulator, tends to be generated easily. For these reasons, it is considered that tin oxide is not suitable as a semiconductor material. Actually, in a field effect transistor using an amorphous oxide semiconductor which is composed of indium oxide, zinc oxide and tin oxide containing tin as a main component, the off current and the hysteresis are large and the threshold voltage (Vth) is significantly negative. Furthermore, although the mobility can be improved by a heat treatment, since the threshold voltage tends to shift in the negative direction greatly according to a heat treatment temperature, there were problems which inhibit practical use such as a large variation in properties of each transistor, poor reliability or the like (for example, see Non-Patent Document 1).

Moreover, an amorphous oxide semiconductor composed of indium oxide, zinc oxide and tin oxide which is obtained by co-sputtering without using tin as a main component has been studied. With this semiconductor, if zinc is contained in an amount of 25 atom % or more, the mobility is lowered to cause the threshold voltage to increase, and if zinc is contained in an amount of less than 25 atom %, the S value is increased to cause the threshold voltage to be negative.

For these reasons, it is believed that it is difficult to find out a composition ratio which can produce a field effect transistor with excellent transistor characteristics (for example, see Non-Patent Document 2).

Under such circumstances, it is believed that, with an amorphous oxide semiconductor which is composed of indium oxide, zinc oxide and tin oxide, production of a field effect transistor suitable for practical use in a display panel or the like is believed to be difficult.

RELATED ART DOCUMENTS

Patent Documents

Patent Document 1: WO2005/088726 A1

Non-Patent Documents

Non-Patent Document 1: M. S. Grover at al., J. Phys. D. 40, 1335 (2007)
Non-Patent Document 2: Kachirayil J. Saji et al., JOURNAL OF THE ELECTROCHEMICAL SOCIETY, 155 (6), H390-395 (2008)

SUMMARY OF THE INVENTION

An object of the invention is to provide a field effect transistor having excellent transistor characteristics (mobility, off current, threshold voltage) and has improved reliability (shift in threshold voltage and moisture resistance) and is suited for use as a display panel.

According to the invention, the following field effect transistor or the like can be provided.

1. A field effect transistor comprising:
  a substrate, and
  at least gate electrode, a gate insulating film, a semiconductor layer, a protective layer for the semiconductor layer, a source electrode and a drain electrode provided on the substrate, wherein
  the source electrode and the drain electrode are connected with the semiconductor layer therebetween,
  the gate insulating film is between the gate electrode and the semiconductor layer,
  the protective layer is on at least one surface of the semiconductor layer,
  the semiconductor layer comprises an oxide containing In atoms, Sn atoms and Zn atoms,
  the atomic composition ratio of Zn/(In+Sn+Zn) is 25 atom % or more and 75 atom % or less, and the atomic composition ratio of Sn/(In+Sn+Zn) is less than 50 atom %.
2. The field effect transistor according to 1, wherein the semiconductor layer satisfies the following condition 1:
Condition 1
(1) the atomic composition ratio of Zn/(In+Sn+Zn) is 40 atom % or more and 65 atom % or less; and
(2) the atomic composition ratio of Sn/(In+Sn+Zn) is 10 atom % or more and less than 23 atom %.
3. The field effect transistor according to 1, wherein the semiconductor layer satisfies the following condition 2:
Condition 2
(1) the atomic composition ratio of Zn/(In+Sn+Zn) is 40 atom % or more and 65 atom % or less; and
(2) the atomic composition ratio of Sn/(In+Sn+Zn) is 1 atom % or more and less than 10 atom %.
4. The field effect transistor according to 1, wherein the semiconductor layer satisfies the following condition 3:
Condition 3
(1) the atomic composition ratio of Zn/(In+Sn+Zn) is 50 atom % or more and 65 atom % or less; and
(2) the atomic composition ratio of Sn/(In+Sn+Zn) is 23 atom % or more and 30 atom % or less.
5. The field effect transistor according to 1, wherein the semiconductor layer satisfies the following condition 4:
Condition 4
(1) the atomic composition ratio of Zn/(In+Sn+Zn) is more than 65 atom % and 75 atom % or less.
6. The field effect transistor according to any one of 1 to 5, wherein the protective layer comprises an oxide.
7. The field effect transistor according to any one of 1 to 5, wherein the protective layer comprises a first protective layer which comprises an oxide and a second protective layer which comprises a nitride.
8. The field effect transistor according to any one of 1 to 7, wherein it has a field effect mobility of 3 $cm^2$/Vs or more, an off current of $2\times10^{-12}$ A or less and a threshold voltage of −1V or more and 5V or less.
9. A sputtering target for forming a semiconductor layer of a field effect transistor, comprising an oxide containing In atoms, Sn atoms and Zn atoms,
  the atomic composition ratio of Zn/(In+Sn+Zn) being 25 atom % or more and 70 atom % or less, and
  the atomic composition ratio of Sn/(In+Sn+Zn) being less than 50 atom %.
10. A sputtering target for forming a semiconductor layer of a field effect transistor, comprising an oxide containing In atoms, Sn atoms and Zn atoms,
  the atomic composition ratio of Zn/(In+Sn+Zn) being 70 atom % or less,
  the atomic composition ratio of In/(In+Sn+Zn) being less than 33 atom %, and
  the atomic composition ratio of Sn/(In+Sn+Zn) being 5 atom % or more and less than 15 atom %.
11. A method for producing the field effect transistor according to any one of 1 to 8, comprising the step of forming a semiconductor layer by using the sputtering target of 9 or 10.
12. The method for producing a field effect transistor according to 11, comprising the step of forming a semiconductor layer, the step of forming a protective layer on the semiconductor layer, and the step of conducting a heat treatment at 150 to 350° C. after these steps.
13. The method for producing a field effect transistor according to 11 or 12, further comprising the step of allowing part of the semiconductor layer to have a lower resistance to form a source electrode or a drain electrode.
14. A panel for a display which comprises the field effect transistor according to any one of 1 to 8.
15. A semiconductor film comprising an oxide containing In atoms, Sn atoms and Zn atoms,
  the atomic composition ratio of Zn/(In+Sn+Zn) being 25 atom % or more and 75 atom % or less,
  the atomic composition ratio of Sn/(In+Sn+Zn) being less than 50 atom %, and
  the average valence number of Sn being +3.2 or more.

According to the invention, since the semiconductor layer contains In, Sn and Zn at a specific composition ratio, and has a protective layer at least on one surface thereof, a highly practical field effect transistor with excellent transistor characteristics (mobility, on/off ratio, off current, S value, threshold voltage (Vth), hysteresis, shift in threshold voltage, moisture resistance) can be obtained.

Moreover, it becomes possible to provide a field effect transistor which exhibits excellent transistor characteristics without adding Ga which is a rare metal.

BRIEF DESCRIPTION OF THE DRAWINGS

FIG. 3b is a view showing the manufacturing steps of the field effect transistor fabricated in Example 1;

BEST MODE FOR CARRYING OUT THE INVENTION

The field effect transistor of the invention has, on a substrate, at least a semiconductor layer, a protective layer of the semiconductor layer, a source electrode, a drain electrode, a gate insulating film and a gate electrode.

Figure 1:
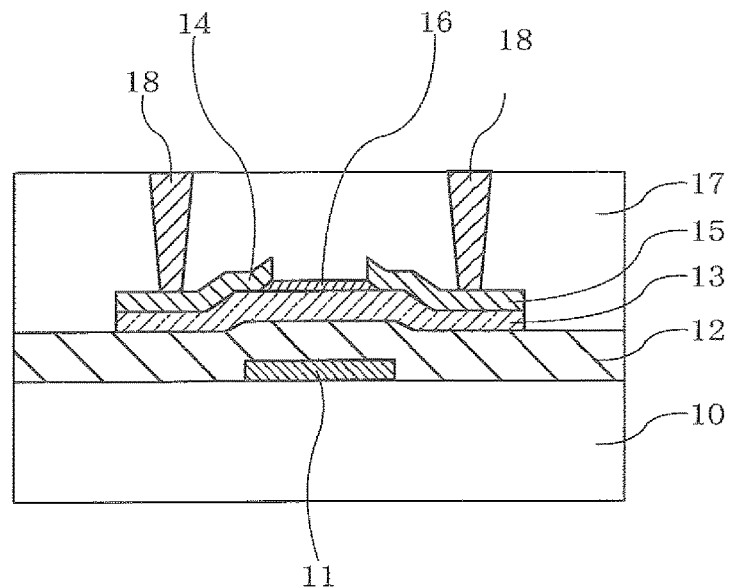
FIG. 1 is a schematic cross-sectional view of the field effect transistor of one embodiment of the invention.

FIG. 1 is a schematic cross-sectional view of a field effect transistor according to one embodiment of the invention.

In this field effect transistor, on a substrate 10, a gate electrode 11 is formed in the shape of a stripe. A gate insulating film 12 is formed so as to cover the gate electrode 11, and a semiconductor layer 13 (active layer) is formed on this gate insulating film 12 above the gate electrode 11.

To one end of the semiconductor layer 13, a source electrode 14 is connected in a direction orthogonally crossing the gate electrode 11. To the other end opposing to the one end of the semiconductor layer 13, a drain electrode 15 is connected.

A first protective layer 16 is formed at a position in the middle of the semiconductor layer 13, the source electrode 14 and the drain electrode 15.

A second protective layer 17 is formed so as to cover the gate insulating film 12, the source electrode 14, the drain electrode 15 and the first protective layer 16.

The second protective layer 17 has a contact hole 18, through which the source electrode 14 or the drain electrode 15 is connected with an external electrode.

The second protective layer 17 is not essential, but is preferably formed.

The field effect transistor of the invention is characterized in that the semiconductor layer 13 contains In atoms, Sn atoms and Zn atoms, and that the atomic composition ratio of Zn/(In+Sn+Zn) is 25 atom % or more and 75 atom % or less, and that the atomic composition ratio of Sn/(In+Sn+Zn) is less than 50 atom %.

By allowing Zn/(In+Sn+Zn) to be 25 atom % or more, an oxygen deficiency is controlled by Zn, whereby a field effect transistor with an appropriate threshold voltage (Vth) can be obtained. Moreover, by allowing Zn/(In +Sn+Zn) to be 75 atom % or less, deterioration of the transistor performance (a lowering in mobility, an increase in off current, an increase in S value, etc.) due to generation of crystals of zinc oxide (ZnO) can be avoided.

It is more preferred that Zn/(In+Sn+Zn) be 30 atom % or more, with 35 atom % or more being further preferable.

Further, by allowing Sn/(In+Sn+Zn) to be less than 50 atom %, deterioration of transistor performance (a lowering in mobility, an increase in off current, an increase in S value, etc.) due to generation of a lower oxide of tin oxide (lowering of average valence of Sn) can be avoided.

Sn/(In+Sn+Zn) is preferably 33 atom % or less, more preferably 28 atom % or less, further preferably less than 23 atom %, with 20 atom % or less being particularly preferable. By allowing Sn/(In+Sn+Zn) to be 33 atom % or less, a field effect transistor with excellent transistor characteristics (mobility, on/off ratio, off current, S value, threshold voltage (Vth), hysteresis, threshold voltage shift, and moisture resistance) can be obtained. Further, deterioration of transistor characteristics such as mobility at the time of being exposed to a reduction atmosphere on the process, for example, plasma exposure at the time of PECVD, or the like can be prevented. The reason therefor is considered that generation of a lower oxide of tin (lowering of the average valence number of Sn) can be controlled.

In the invention, due to the presence of Sn atoms in the semiconductor layer 13, improvement in resistance to moisture, improvement in chemicals resistance (including improvement in PAN resistance) and stability to the atmosphere temperature can be expected. Further, due to the presence of Sn, the content of In, as a rare metal, can be reduced.

Sn/(In+Sn+Zn) is preferably 1 atom % or more, more preferably 3 atom % or more, further preferably 5 atom % or more, with 10 atom % or more being particularly preferable.

Regarding the composition of the semiconductor layer, it is preferred that any of the following conditions 1 to 4 be satisfied.

Condition 1
(1) the atomic composition ratio of Zn/(In +Sn+Zn) is 40 atom % or more and 65 atom % or less
(2) the atomic composition ratio of Sn/(In +Sn+Zn) is 10 atom % or more and less than 23 atom %

Condition 2
(1) the atomic composition ratio of Zn/(In+Sn+Zn) is 40 atom % or more and 65 atom % or less
(2) the atomic composition ratio of Sn/(In+Sn+Zn) is 1 atom % or more and less than 10 atom %

Figure 2:
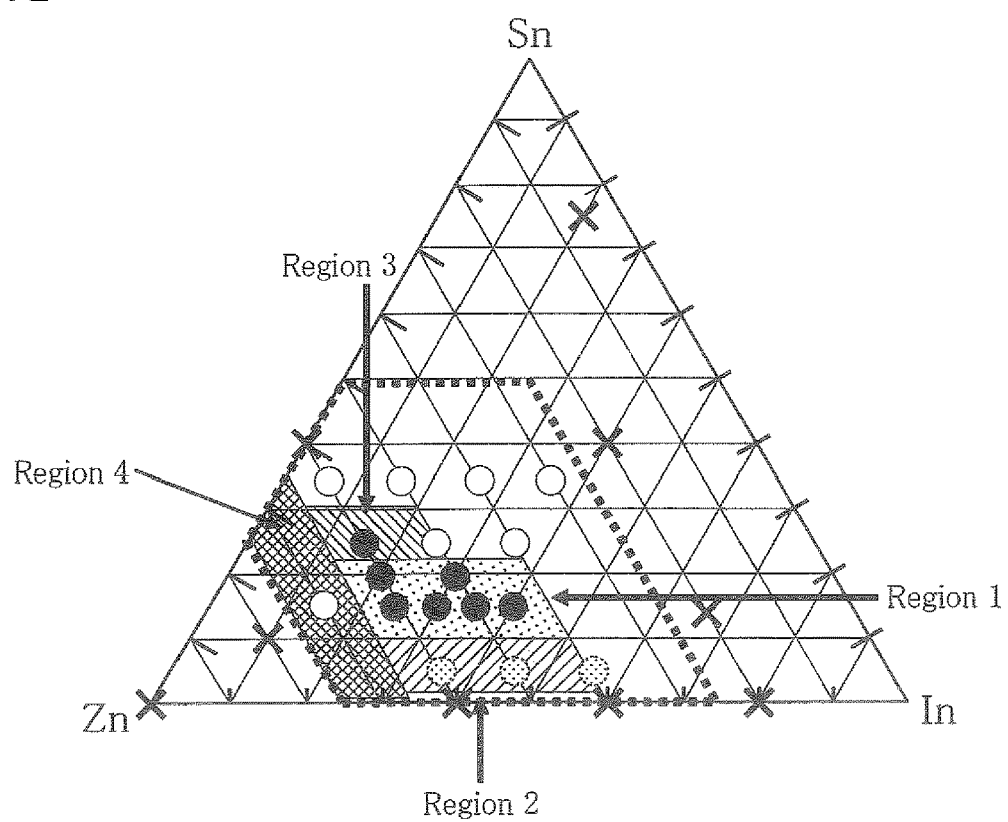
FIG. 2 is a view showing the preferable composition conditions (region) of the semiconductor layer in the invention.

Condition 3
(1) the atomic composition ratio of Zn/(In+Sn+Zn) is 50 atom % or more and 65 atom % or less
(2) the atomic composition ratio of Sn/(In+Sn+Zn) is 23 atom % or more and 30 atom % or less
Condition 4
(1) the composition ratio of Zn/(In +Sn+Zn) is more than 65 atom % and 75 atom % or less FIG. 2 shows the preferable composition conditions (region) of the semiconductor layer in the invention.

If the composition of the semiconductor layer is in the region 1, a field effect transistor which is significantly improved in transistor characteristics (mobility, on/off ratio, off current, S value, threshold voltage (Vth), hysteresis, shift in threshold voltage, moisture resistance) can be obtained. In addition, since wet etching can be used for the formation of the semiconductor layer and the source/drain electrodes, a large-sized panel can be produced at a low cost. Therefore, it is particularly suited for use in organic EL displays or liquid crystal displays.

Of the region 1, the following range is most preferable.
(1) the atomic composition ratio of Zn/(In +Sn+Zn) is 57 atom % or more and 65 atom % or less
(2) the atomic composition ratio of Sn/(In +Sn+Zn) is 10 atom % or more and less than 18 atom %

Within the above-mentioned ranges, an excellent field effect transistor having high mobility ($cm^2/Vs$), a high on-off ratio, a small off current and a small S value, and has a small shift ΔVth(V) in threshold voltage can be obtained. Further, within the above-mentioned ranges, since the content of In (indium), which is a scarce resource, is small, an excellent target and improved field effect transistor can be obtained at a low material cost, and hence, industrially best suited.

When the composition of the semiconductor layer is in the region 3, the semiconductor layer has a high process resistance, and hence, there is only a small possibility of being deteriorated even if the process temperature is high. Moreover, a field effect transistor improved in moisture resistance can be obtained. Therefore, this range is suited for use in an inorganic EL display which is processed at a high temperature.

If the composition of the semiconductor layer is in the region 2, excellent characteristics can be attained by a low-temperature heat treatment. Therefore, this range is particularly suited for applications where a resin substrate or the like with a low heat resistance is used (a flexible display, for example).

If the composition of the semiconductor layer is in the region 4, a field effect transistor with a low off current can be obtained. Further, since zinc is the main component, the raw material cost is low, and there is no need to recover raw materials from the product. Therefore, this range is particularly suited for disposable applications (IC tag or the like).

In the composition of the semiconductor layer, the atomic ratio of Sn atoms and In atoms (Sn/In) is particularly preferably 0.41 or more and 0.69 or less. If the atomic ratio is 0.41 or more, moisture resistance is increased, and if the atomic ratio is 0.69 or less, improved transistor properties can be obtained at a low-temperature process. In addition, deterioration of transistor characteristics (a lowering in mobility, an increase in off current, an increase in S value, etc.) due to the generation of a lower oxide of tin oxide (lowering of the average number of valences of Sn) can be avoided.

In addition to In, Sn and Zn, the semiconductor layer may contain an element selected from Ga, Al, B, Sc, Y, a lanthanoid (La, Ce, Pr, Nd, Sm, Eu, Gd, Tb, Dy, Ho, Er, Tm, Yb, Lu), Zr, Hf, Ge, Si, Ti, Mn, W, Mo, V, Cu, Ni, Co, Fe, Cr and Nb in an amount of 0 to 20 atom %.

It is preferred that the Na content be less than 100 ppm. If the Na content is less than 100 ppm, reliability to a voltage stress is improved since the amount of ions which are movable by application of a voltage (ΔVth will be lowered) is small.

Each constituting element of the field effect transistor will be explained below.

1. Substrate

There are no particular restrictions, and known substrates in the art can be used. For example, glass substrates such as alkali silicate glass, non-alkali glass and quartz glass, silicon substrates, resin substrates such as acryl, polycarbonate and polyethylene naphthalate (PEN) and polymer film bases such as polyethylene terephthalate (PET) and polyamides. The thickness of the substrate or the base is normally 0.1 to 10 mm, preferably 0.3 to 5 mm. In the case of a glass substrate, it is preferable to use a glass substrate which is chemically or thermally reinforced. If transparency or smoothness is required, a glass substrate and a resin substrate are preferable, with a glass substrate being particularly preferable. If a substrate is required to be light in weight, it is preferable to use a resin substrate or a polymer base.

2. Semiconductor Layer

As mentioned above, the semiconductor layer is composed of a composite oxide containing each of In, Zn and Sn atoms. Such a semiconductor layer is producible by, for example, forming a thin film using the composite oxide target (target for semiconductor layers) of the invention which will be mentioned later.

Further, a semiconductor layer may be formed by dissolving a particulate oxide semiconductor in a solvent, applying or printing the oxide semiconductor solution, and then evaporating the solvent by heating. This method is preferable due to low equipment cost and high energy efficiency.

Although a solution can be used such as the sol-gel method or CVD can be used, in view of improved transistor characteristics, it is most preferable to form a film uniformly in a large area by sputtering using a semiconductor target.

In the invention, it is preferred that the semiconductor layer be an amorphous film. If the semiconductor layer is an amorphous film, adhesiveness to an insulating film and a protective film may be improved or uniform transistor characteristics can be easily obtained even if the area is large. Whether the semiconductor film is amorphous or not can be confirmed by an X-ray crystal structure analysis. If no clear peak is observed, the film is amorphous.

Moreover, it is preferred that the electron carrier concentration of the semiconductor layer be $10^{13}$ to $10^{18}/cm^3$, with $10^{14}$ to $10^{17}/cm^3$ being particularly preferable. The electron carrier concentration in the above-mentioned range is preferable, since the semiconductor layer tends to be a non-degenerated semiconductor easily, and when used as a transistor, the mobility and the on/off ratio are preferably well-balanced. If the carrier density is $10^{18}$ $cm^{-3}$ or less, the off current can be reduced to allow the transistor to be normally off easily. If the carrier density is $10^{13}$ $cm^{-3}$ or more, the mobility can be improved.

The specific resistance is preferably $10^{-1}$ to $10^9$ Ωcm. More preferably, the specific resistance is 10 to $10^7$ Ωcm, with $10^2$ to $10^5$ Ωcm being particularly preferable. If the specific resistance is $10^{-1}$ Ωcm or more, the off current can be decreased. If the specific resistance is $10^9$ Ωcm or less, the mobility can be increased and the threshold voltage can be decreased.

It is preferred that the band gap be 2.0 to 6.0 eV, with 2.8 to 5.0 eV being more preferable. If the band gap is smaller than 2.0 eV, the semiconductor layer absorbs visible light to cause a field effect transistor to malfunction. On the other hand, if the band gap is larger than 6.0 eV, the carriers may not be supplied easily, and hence, the field effect transistor may not function.

It is preferred that the semiconductor layer be a non-degenerate semiconductor which shows thermal activity. If the semiconductor layer is a degenerate semiconductor, the off current/gate leakage current may be increased due to an excessive number of carriers, and hence, the threshold value may be negative to allow the transistor to be normally-on. It is possible to judge whether the semiconductor layer is a non-degenerate semiconductor by measuring the mobility and the carrier density while changing the temperature by using the hall effect. Moreover the semiconductor layer is allowed to be a non-degenerate semiconductor by adjusting the amount of oxygen deficiency by controlling the partial oxygen pressure at the time of film formation and conducting a post treatment, whereby the carrier density can be optimized.

The surface roughness (RMS) of the semiconductor layer is preferably 1 nm or less, further preferably 0.6 nm or less, and particularly preferably 0.3 nm or less. If the surface roughness is larger than 1 nm, the mobility may be lowered.

It is preferred that the semiconductor layer be an amorphous film which retains at least part of the edge-sharing structure of the bixbyite structure of indium oxide. Whether the amorphous film containing indium oxide keeps at least part of the edge-sharing structure of the bixbyite structure of indium oxide can be confirmed by the presence of a peak derived from In—X (X is In, Zn) between 0.30 to 0.36 nm by using a radial distribution function (RDF) obtained by grazing incidence X-ray scattering (GIXS) conducted by using high-luminance synchrotron radiation or the like (for details, please refer to F. Utsuno, et al., Thin Solid Films, Volume 496, 2006, Pages 95-98).

Further, if the maximum value of RDF at an interatomic distance of 0.30 to 0.36 nm is taken as A and the maximum value of RDF at an interatomic distance of 0.36 to 0.42 is taken as B, it is preferred that the relationship A/B>0.7 be satisfied. A/B>0.85 is more preferable, A/B>1 is further preferable, with A/B>1.2 being particularly preferable.

If the NB is 0.7 or less, when the semiconductor layer is used as the active layer of a transistor, the mobility may be lowered, the threshold value or the S value may be too large. A small NB appears to be caused by a poor short range order of the amorphous film.

It is preferred that the average In—In bonding distance be 0.3 to 0.322 nm, with 0.31 to 0.32 nm being particularly preferable. The average In—In bonding distance can be obtained by the X-ray absorption spectroscopy. In the measurement by the X-ray absorption spectroscopy, an extended X-ray absorption fine structure (EXAFS) extending to energy higher by several hundreds eV from the rising edge is shown. The EXAFS is caused by backward scattering of electrons by atoms surrounding excited atoms. An interference of a wave of electrons which are jumped out and a wave of electrons which are scattered backwardly occurs. The interference depends on the wavelength in the electron state and the light path in which electrons move to surrounding atoms. A radial distribution function (RDF) can be obtained by Fourier transforming EXAFS. The average bonding distance can be estimated from the peak of RDF.

The thickness of the semiconductor layer is normally 0.5 to 500 nm, preferably 1 to 150 nm, more preferably 3 to 80 nm, and particularly preferably 10 to 60 nm. If the thickness is smaller than 0.5 nm, it is difficult to conduct film formation uniformly on the industrial scale. If the thickness is larger than 500 nm, the film forming time is prolonged, resulting in difficulty in industrial application. If the thickness is within a range of 3 to 80 nm, TFT characteristics such as mobility and on-off ratio are significantly excellent.

In the invention, it is preferred that the energy width ($E_0$) on the non-localized level be 14 meV or less. The energy width ($E_0$) on the non-localized level of the semiconductor layer is more preferably 10 meV or less, further preferably 8 meV or less, and particularly preferably 6 meV or less. If the energy width ($E_0$) on the non-localized level exceeds 14 meV, the mobility may be lowered or the threshold value or the S value may be too large when the semiconductor layer is used as the active layer of a transistor. A large energy width ($E_0$) on the non-localized level of the semiconductor layer appears to be caused by a poor short range order of the amorphous film.

The average valence number of Sn measured by the X ray photoelectron spectroscopy (XPS) is preferably +3.2 or more, more preferably +3.6 or more, with +3.8 or more being further preferable. Although the upper limit is not particularly limited, it is usually +4.0 or less. In the XPS valence band spectrum, a band derived from Sn5s is seen only in the spectrum of SnO (electron configuration of Sn+2:$4d^{10}5s^2$) which is a lower oxide, and is not seen in the spectrum of $SnO_2$ (electron configuration of Sn+4:$4d^{10}$). Therefore, the average valence number of Sn can be obtained from the relative intensity of the Sn5s band (reference: X RAY PHOTOELECTRON SPECTROSCOPY, 1998, published by Maruzen Co., Ltd.). Normally, the average valence number of Sn of the $SnO_2$ film formed by sputtering is about +2.8.

In the fine structure analysis of around each of In, Sn and Zn atoms using the X-ray absorption fine structure (XAFS) analysis, when the structure around the Sn element has a structure similar to that of $SnO_2$, a lowering in the mobility by scattering can be preferably suppressed. Further, when the structure around each of In and Zn elements has a structure similar to that an IZO thin film, an amorphous film can be preferably stabilized by Zn.

In addition, when conducting the above-mentioned analysis, data sufficient for the analysis cannot be obtained by a normal fluorescence method. Therefore, it is preferable to measure by using the grazing incidence method in which a multi-element SSD is used and a thin film sample substrate is inclined at a slight angle to cause radiation to be entered.

3. First and Second Protective Layers

Due to the presence of the protective layers, it is possible to prevent oxygen on the surface layer of the semiconductor from being removed in a vacuum or under a low pressure, thereby preventing the off current to be increased and the threshold voltage to be negative. Further, even in an atmosphere, the transistor cannot be affected by the influence of the circumference, such as humidity, and hence, generation of variations in transistor characteristics, such as threshold voltage, can be prevented.

There are no particular restrictions on the material for forming the protective layer. Materials which are commonly used can be selected arbitrarily within a range which does not impair advantageous effects of the invention. For example, compounds such as $SiO_2$, SiNx, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN or the like may be used. Of these, it is preferable to use $SiO_2$, SiNx, $Al_2O_3$, $Y_2O_3$, $Hf_2O_3$ and $CaHfO_3$, with $SiO_2$, SiNx, $Y_2O_3$, $Hf_2O_3$ and $CaHfO_3$ being more preferable. It is particularly preferred that the protective layer be formed of an oxide, and oxides such as $SiO_2$, $Y_2O_3$, $Hf_2O_3$ and $CaHfO_3$ are preferable. The oxygen number of these oxides may not necessarily coincide with the stoichiometrical ratio (for example, they may be $SiO_2$ or SiOx). SiNx may contain a hydrogen element.

Such a protective layer may be a stack structure in which two or more different insulating films are stacked.

The protective layer may be crystalline, polycrystalline or amorphous. It is preferred that the layer be polycrystalline or amorphous since it can be produced easily on the industrial scale. In particular, it is preferred that the protective layer be amorphous. If the protective layer is an amorphous film, the interface has good smoothness, and as a result, improvement in mobility, suppression of the threshold voltage and suppressive effects of the S value can be expected. Further, gate current leakage can be suppressed.

It is preferred that the protective layer of the semiconductor layer be an amorphous oxide or an amorphous nitride, with an amorphous oxide being particularly preferable. If the protective layer is not an oxide, oxygen in the semiconductor moves toward the protective layer, and as a result, the off current may be increased or the threshold voltage may be negative to cause the transistor to be normally-off. An organic insulating film such as poly(4-vinylphenol)(PVP) or parylene may be used in the protective layer of the semiconductor layer. Further, the protective layer of the semiconductor layer may have a stack structure in which an inorganic insulating film and an organic insulating film are stacked in two or more.

In particular, it is preferred that the first protective layer which is largely in contact with the semiconductor layer and that the second protective layer be formed of a nitride such as SiNx. Due to such a configuration, good transistor characteristics and moisture resistance can be easily attained.

Although the protective layer can be formed by PECVD, TEOSCVD, Cat-CVD, sputtering, spin-coating, the printing method, or the like, PECVD or sputtering is industrially preferable, with PECVD being particularly preferable.

4. Gate Insulating Film

There are no particular restrictions on the material for forming the gate insulating film. Materials which are commonly used can be selected arbitrarily within a range in which advantageous effects of the invention are not impaired. For example, compounds such as $SiO_2$, SiNx, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$ and $CaHfO_3$, $PbTi_3$, $BaTa_2O_6$, $SrTiO_3$, AlN or the like may be used. Of these, it is preferable to use $SiO_2$, SiNx, $Al_2O_3$, $Y_2O_3$, $Hf_2O_3$, $CaHfO_3$, with $SiO_2$, SiNx, $Y_2O_3$, $Hf_2O_3$ and $CaHfO_3$ being more preferable. The oxygen number of these oxides may not necessarily coincide with the stoichiometrical ratio (for example, they may be $SiO_2$ or SiOx). SiNx may contain a hydrogen element.

The gate insulating film may be a stack structure in which two or more different insulating films are stacked. The gate insulating film may be crystalline, polycrystalline or amorphous. It is preferred that the gate insulating film be polycrystalline or amorphous since it can be produced easily on the industrial scale.

An organic insulating film such as poly(4-vinylphenol) (PVP) or parylene may be used in the gate insulating film. Further, the gate insulating film may have a stack structure in which an inorganic insulating film and an organic insulating film are stacked in two or more.

Although the gate insulating film can be formed by PECVD, TEOSCVD, Cat-CVD, sputtering, spin-coating, the printing method, or the like, PECVD or sputtering is industrially preferable, with PECVD being particularly preferable.

5. Electrode

There are no particular restrictions on the material for forming each of the gate electrode, the source electrode and the drain electrode. Materials which are commonly used can be arbitrarily used within a range in which the advantageous effects of the invention are not impaired.

For example, transparent electrodes such as indium tin oxide (ITO), indium zinc oxide, ZnO and $SnO_2$, metal electrodes such as Al, Ag, Cr, Ni, Mo, Au, Ti, Ta and Cu, or metal electrodes of alloys containing these metals can be used. In addition, it is preferable to stack two or more of these layers to decrease contact resistance or to increase interfacial strength. In order to decrease the interfacial resistance of the source electrode and the drain electrode, it is preferable to subject the interface between the semiconductor layer and the electrode to a plasma treatment, an ozone treatment or the like to control the resistance.

In the invention, part of the semiconductor layer may be allowed to have a low resistance to form a source electrode or a drain electrode.

In order to decrease the resistance of part of the semiconductor layer, for example, a method in which a heat treatment is conducted or energy rays such as UV rays are irradiated under a low partial oxygen pressure, under an inert gas, under a low pressure or in a vacuum, or a method in which plasma is irradiated in an atmosphere of an inert gas such as hydrogen, nitrogen or argon can be used.

Further, when stacking a protective layer of SiNx etc. by the plasma CVD, the resistance of the part of the semiconductor layer can be reduced by adjusting plasma conditions, such as the amount of hydrogen.

It is preferred that the field effect transistor of the invention have a structure capable of shielding the semiconductor layer from light (for example, a light-shielding layer). If it does not have a structure capable of shielding the semiconductor layer from light (light-shielding layer), carrier electrons may be excited when light is incident on the semiconductor layer, resulting in an increased off current. The light-shielding layer is preferably a thin film having an absorption at a wavelength of 300 to 800 nm. The light-shielding layer may be provided above or under the semiconductor layer. It is preferred that the light-shielding layers be provided on both above and under the semiconductor layer. The light-shielding layer may be used as the gate insulating film, the black matrix or the like. If the light-shielding layer is provided on only either above or below, it is preferable to contrive the structure in order not to allow light to be incident on the semiconductor layer from the side on which no light-shielding layer is provided.

In the field effect transistor of the invention, a contact layer may be provided between the semiconductor layer, and the source/drain electrodes. It is preferred that the contact layer have a resistance lower than that of the semiconductor layer. A composite oxide having a composition similar to that of the above-mentioned semiconductor layer may be used in forming a contact layer. That is, it is preferred that the contact layer contain each of In, Zn or the like. If the contact layer does not contain these elements, elements may move between the contact layer and the semiconductor layer, and a shift in threshold voltage may be increased when a stress test or the like is conducted.

There are no particular restrictions on the method for forming the contact layer. It is possible to form a contact layer having the same composition ratio as that of the semiconductor layer by changing film forming conditions, to form a layer having a composition ratio different from that of the semiconductor layer, to form a contact layer by subjecting a part of the semiconductor layer which contacts the electrode to a plasma treatment or an ozone treatment to increase the resistance thereof, or to form a layer having a higher resistance by adjusting film forming conditions such as an oxygen partial pressure when forming a semiconductor layer. In the field effect transistor of the invention, it is preferred that an oxide resistant layer having a higher resistance than that of the semiconductor layer be formed between the semiconductor layer and the gate insulating film and/or between the semiconductor layer and the protective layer. Without an oxide resistant layer, an off current may be generated, the threshold voltage may become negative to allow the transistor to be normally on, or the semiconductor layer may be denatured to cause the properties to deteriorate during the formation of the protective layer or during post treatments such as etching.

Next, an explanation is made on the method for producing a field effect transistor of the invention.

The method for producing according to the invention includes a step of forming a semiconductor layer using the target of the invention, which will be mentioned later.

Moreover, it is characterized in that includes a step of forming the semiconductor layer and forming the protective layer on the semiconductor layer, and it includes a step of subjecting the protective layer to a heat treatment at 150 to 350° C. after forming the protective layer. Each of the constituting elements (layer) of the above-mentioned field effect transistor can be formed by a technique which is known in the art.

Specifically, as the film forming method, chemical film forming methods such as the spray method, the dipping method and the CVD method, or physical film forming methods such as the sputtering method, the vacuum vapor deposition method, the ion plating method and the pulse laser deposition method can be used. In respect of easiness in controlling the carrier density and easiness in improving film quality, it is preferable to use a physical film forming method. More preferably, the sputtering method is used due to its high productivity.

In the sputtering, it is possible to use a method in which a sintered target of a composite oxide is used, a method in which co-sputtering is conducted by using a plurality of sintered targets and a method in which reactive sputtering is conducted by using an alloy target. However, in the method of using the sintered target of a composite oxide, as compared with the method in which co-sputtering is conducted by using a plurality of sintered targets or the method in which reactive sputtering is conducted by using an alloy target, uniformity or reproducibility is improved, the energy width ($E_0$) of the non-localized level is reduced, whereby transistor characteristics can be improved, for example, improvement in mobility, reduction of the S value, reduction of the threshold voltage, etc. Preferably, a sintered target formed of a composite oxide is used. Although known methods such as RF, DC and AC sputtering can be used, in respect of uniformity and mass productivity (equipment cost, film forming speed), DC or AC sputtering is preferable. In order to allow the average valence number of Sn measured by the X-ray photoelectron spectroscopy (XPS) to be +3.2 or more, RF sputtering is preferable.

As for the substrate temperature at the time of film forming, room temperature (30° C.) or more and 250° C. or less is preferable, with 50° C. or more and 200° C. or less being more preferable. When the substrate temperature is 250° C. or less, a decrease in off current can be expected when a TFT is fabricated. If the substrate temperature is room temperature (30° C.) or more, variations in film forming conditions caused by an increase in substrate temperature in the case of continuous film formation can be suppressed.

Further, it is preferred that a measure for increasing the oxygen intake amount be taken at the time of film formation. As such a measure to increase the oxygen intake amount at the time of film formation, flowing a mixed gas of an inert gas (argon or the like) and oxygen, increasing the oxygen radical (ozone) amount by the ozone assist method or RF sputtering, adjusting the distance with the substrate, input power and the total pressure or the like can be given.

It is preferred that the film formation be conducted at an oxygen partial pressure of $10^{-3}$ Pa to $10^{-1}$ Pa, more preferably, $5 \times 10^{-3}$ Pa to $10^{-1}$ Pa. If the film formation is conducted at an oxygen partial pressure of $10^{-3}$ Pa or more, generation of a lower oxide of tin oxide can be suppressed. At an oxygen partial pressure of $10^{-1}$ Pa or less, a faster film forming speed can be expected.

The film formed can be patterned by various etching methods.

In the invention, the semiconductor layer is more preferably formed by DC or AC sputtering by using the target of the invention. By using DC sputtering or AC sputtering, damage during film forming may be suppressed as compared with the case of RF sputtering. In order to obtain a high average valence number of Sn measured by XPS, RF sputtering may be used. By using RF sputtering, the average valence number of Sn measured by XPS can be controlled easily. Therefore, when used in the field effect transistor, effects such as a reduced shift in threshold voltage, an improved mobility, a decreased threshold voltage and a decreased S value can be expected.

In the invention, it is preferred that a heat treatment be conducted at 150 to 350° C. after the formation of the semiconductor layer. In particular, after the formation of the semiconductor layer and the protective layer for the semiconductor layer, it is preferable to conduct a heat treatment at 150 to 350° C. If a heat treatment is conducted at a temperature lower than 150° C., the resulting transistor may have a lowered resistance or stability to heat, a decreased mobility, an increased S value or an increased threshold value. On the other hand, if the heat treatment temperature is higher than 350° C., a substrate which does not have heat resistance may not be used or the equipment cost for the heat treatment may be incurred.

The heat treatment temperature is preferably 160 to 300° C., more preferably 170 to 260° C., and particularly preferably 180 to 240° C. In particular, a heat treatment temperature of equal to or lower than 180° C. is preferable, since a resin substrate with a low heat resistance such as PEN can be used as a substrate.

Although a heat treatment is conducted preferably normally for 1 second to 24 hours, it is preferable to adjust the heat treatment time according to the treatment temperature. For example, at a heat treatment temperature of 70 to 180° C., the heat treatment time is preferably 10 minutes to 24 hours, more preferably 20 minutes to 6 hours, and particularly preferably 30 minutes to 3 hours. At a heat treatment temperature of 180 to 260° C., the heat treatment time is more preferably 6 minutes to 4 hours, further preferably 15 minutes to 2 hours. At a heat treatment temperature of 260 to 300° C., the heat treatment time is more preferably 30 seconds to 4 hours, and particularly preferably 1 minute to 2 hours. At a heat treatment temperature of 300 to 350° C., the heat treatment time is more preferably 1 second to 1 hour, particularly preferably 2 seconds to 30 minutes.

It is preferred that the heat treatment be conducted in an environment where an oxygen partial pressure is $10^{-3}$ Pa or less in an inert gas or be conducted after the semiconductor layer is covered by the protective layer. In the above-mentioned conditions, reproducibility is improved.

It is particularly preferred that a heat treatment be conducted at 150 to 350° C. after the formation of the semiconductor layer. Further, it is particularly preferred that a heat treatment be conducted at 150 to 350° C. after the protective layer of the semiconductor is formed. Due to the above-mentioned heat treatment, in addition to the improvement in semiconductor properties, reproducibility and uniformity are improved, and dependency of a semiconductor film on film-forming conditions is reduced.

In a typical field effect transistor, when about 5 to 20 V voltage Vd is impressed between the source/drain electrodes, current Id flowing between the source/drain electrodes can be controlled (on off) by switching the gate voltage Vg between 0 V and 5-20 V.

There are various criteria for evaluating transistor characteristics, and the electric field effect mobility μ, threshold voltage (Vth), the on/off ratio, the S value, etc. can be given.

The field effect mobility can be obtained from the characteristic in the linear region or the saturation region. For example, a method in which a graph √(Id)–Vd is prepared from the results of the transfer characteristics, and a field effect mobility is induced from the gradient of this slope. In this specification, unless otherwise particularly indicated, evaluation is conducted by this technique.

Although there are some methods to obtain a threshold voltage, for example, a method in which a threshold voltage can be induced from an x intercept of the graph of √Id–Vg can be given.

The on-off ratio can be obtained from the ratio of the largest Id and the smallest Id in the transfer characteristics.

The S value can be obtained by preparing a graph of Log (Id)–Vd from the results of the transfer characteristics, and can be calculated from the reciprocal of this gradient.

The S value is expressed in terms of V/decade, and a smaller S value is preferable. The S value is preferably 1.0 V/dec or less, more preferably 0.5 V/dec or less, further preferably 0.3 V/dec or less and particularly preferably 0.1 V/dec or less. If the S value is 0.8 V/dec or less, a driving voltage may be low, whereby the consumption power can be reduced. In particular, when used in an organic EL display which is driven by DC current, it is preferable to suppress the S value to 0.3 V/dec or less since the consumption power can be significantly decreased. Meanwhile, the S value (Swing Factor) is a value indicating the sharpness of the rising of the drain current from the off-state to the on-state when the gate voltage is increased from the off-state. Specifically, the S value is defined by the following formula. As shown by the following formula, the S value is an increase in gate voltage when the drain current is increase by one digit (10 times).

$$S \text{ value} = dVg/d \log(Ids)$$

A smaller S value means a sharp rising ("Thin Film Transistor Technology", by Ukai Yasuhiro, 2007, published by Kogyo Chosakai Publishing, Inc.) When the S value is large, a high gate voltage is required to be applied when switching from the on-state to the off-state, which may result in an increased consumption power.

The mobility of the field effect transistor of the invention preferably is 3 $cm^2/Vs$ or more, more preferably 8 $cm^2/Vs$ or more, further preferably 10 $cm^2/Vs$ or more and particularly preferably 16 $cm^2/Vs$ or more. If the mobility is smaller than 3 $cm^2/Vs$, the switching speed may be too slow to be used in a large-area, high-precision display.

The on-off ratio is preferably $10^7$ or more, more preferably $10^8$ or more and particularly preferably $10^9$ or more.

The off current is particularly preferably $2\times10^{-12}$ A (2 pA) or less, more preferably 1 pA or less, with 0.1 pA or less being particularly preferable. If the off current is smaller than 2 pA, if used as a TFT in a display, contrast may be improved or the uniformity of the screen may be improved.

The gate leakage current is preferably 1 pA or less. If the gate leakage is smaller than 1 pA, when used as a TFT of a display, deterioration of contrast can be suppressed.

The threshold voltage is normally −1 to 5 V, preferably −0.5 to 3 V, more preferably 0 to 2 V, with 0 to 1 V being particularly preferable. If the threshold voltage is larger than −1 V, a smaller voltage may be imposed on the off time, thereby to reduce the consumption power. If the threshold voltage is smaller than 5 V, a driving voltage may be decreased to reduce the consumption power.

The shift amount in threshold voltage before and after the application of a direct voltage of 10 μpA at 50° C. for 100 hours is preferably 1.0 V or less, more preferably 0.5 V or less. If the shift amount is smaller than 1 V, when used as a transistor of an organic EL display, change with time of the image quality can be decreased.

It is preferred that hysteresis when the gate voltage is increased or decreased in a transmission curve be small. If the hysteresis is small, the driving voltage may be reduced.

The ratio (W/L) of the channel width W and the channel length L is normally 0.1 to 100, preferably 0.5 to 20 and particularly preferably 1 to 8. If the W/L exceeds 100, the current leakage may be increased or the on-off ratio may be decreased. If the W/L is smaller than 0.1, the field effect mobility may be lowered or the pinch off may be unclear. Further, the channel length L is normally 0.1 to 1000 μm, preferably 1 to 100 μm, more preferably 2 to 10 μm. If the channel length is less than 0.1 μm, it is difficult to produce the transistor on the industrial scale, and the current leakage may be increased. A channel length exceeding 1000 μm is not preferable since it makes the device too large in size.

Next, the sputtering target for forming a semiconductor layer according to the invention will be explained.

The sputtering target of the invention normally contains In atoms, Sn atoms and Zn atoms, and the atomic composition ratio of Zn/(In+Sn+Zn) is 25 atom % or more and 70 atom % or less, and the atomic composition ratio of Sn/(In+Sn+Zn) is less than 50 atom %.

Further, it is preferred that the sputtering target of the invention be an oxide sintered body containing In atoms, Sn atoms and Zn atoms, and that the atomic composition ratio of Zn/(In+Sn+Zn) be 70 atom % or less, the atomic composition ratio of In/(In+Sn+Zn) be less than 33 atom %, and the atomic composition ratio of Sn/(In+Sn+Zn) be 5 atom % or more and less than 15 atom %.

If the atomic composition ratio of Zn/(In+Sn+Zn) is 70 atom % or less, lowering in relative density or increase in bulk resistance due to generation of an Zn oxide can be prevented. If the atomic composition ratio of In/(In+Sn+Zn) is less than 33 atom %, an increase in cost due to an increase in raw material cost can be prevented easily. If the atomic composition ratio of Sn/(In+Sn+Zn) is 5 atom % or more, the valences of Sn and Zn are well-balanced, whereby the relative density of the target increases and the bulk resistance of the target can be reduced easily. If the atomic composition ratio of Sn/(In+Sn+Zn) is less than 15 atom %, an increase in bulk resistance due to generation of a lower oxide of Sn can be prevented easily. That is, if the atomic composition ratio of Sn/(In+Sn+Zn) is in the above-mentioned range, a target with a high relative density and a low resistance can be stably fabricated. Further, A field effect transistor with improved characteristics (mobility, on/off ratio, S value, $\Delta$Vth shift) can be obtained using this target. In addition, the content of In (indium), which is a scarce resource, is small, a good target can be obtained at a low raw material cost, and hence the above-mentioned range is best suited for the industrial application.

Furthermore, it is particularly preferred that the atomic composition ratio of Zn/(In+Sn+Zn) be 60 atom % or more and 67 atom % or less, the atomic composition ratio of In/(In+Sn+Zn) be 18 atom % or more and 28 atom % or less, and the atomic composition ratio of Sn/(In+Sn+Zn) be 7 atom % or more and 14 atom % or less.

As the starting material of the target, generally, indium oxide powder, zinc oxide powder and tin oxide powder are used. However, the simple substance, compound, composite oxide of them may be used as a raw material.

The purity of each raw material powder is normally 99.9% (3N) or more, preferably 99.99% (4N) or more, further preferably 99.995% or more, and particularly preferably 99.999% (5N) or more. If the purity of each raw material powder is less than 99.9% (3N), problems caused by impurities may arise that the semiconductor properties may be lowered, reliability may be lowered or the like. If the Na content is less than 100 ppm, reliability is preferably improved when a thin film transistor is fabricated.

As for the raw material powder, it is preferable to use mixed powder with a specific surface area of 3 to 16 $m^2/g$ containing indium oxide powder, tin oxide powder, zinc powder or composite oxide powder and having a specific surface area of the entire powder of 3 to 16 $m^2/g$. It is preferable to use power in which the specific surface areas of each oxide powder are almost the same. As a result, pulverizing and mixing can be conducted more efficiently. Specifically, it is preferred that the specific surface area ratio be ¼ to 4 times, with ½ to 2 times being particularly preferable. If the specific surface areas are too different, pulverization and mixing cannot be conducted efficiently, and there may be a case where particles of an oxide may remain in a sintered body. However, it is preferred that the specific surface area of zinc oxide be smaller than the specific surface areas of indium oxide and tin oxide. With these specific surface areas, unevenness in color of the target can be suppressed.

The powder mixture is pulverized and mixed, for example, by means of a wet medium stirring mill. At this time, it is preferable to conduct pulverization such that the specific surface area after the pulverization be increased in an amount of 1.0 to 3.0 $m^2/g$ as compared with the specific surface area of the raw material powder mixture, or such that the average median diameter after the pulverization become 0.6 to 1 µm. By using the raw material powder prepared in this way, it is possible to obtain a high-density oxide sintered body without the need of pre-firing process. A reduction step will also be unnecessary.

If an increase in specific surface area of the raw material powder mixture is less than 1.0 $m^2/g$ or the average median diameter of the raw material powder mixture after pulverization exceeds 1 µm, the sintered density may not be sufficiently large. On the other hand, if an increase in specific surface area of the raw material powder mixture exceeds 3.0 $m^2/g$ or if the average median diameter after the pulverization is less than 0.6 µm, the amount of contaminants (the amount of impurities which have been mixed in) from a pulverizer or the like during the pulverization may be increased.

Here, the specific surface area of each powder is a value measured by the BET method. The median diameter of each powder is a value measured by a particle size distribution analyzer. These values can be adjusted by pulverizing powder by a dry pulverization method, a wet pulverization method or the like.

The desired mixing ratio of the raw material powder, the mixing method and the molding method are not particularly limited, and various wet methods or dry methods which have heretofore been known can be used.

Examples of the dry method include the cold press method and the hot press method. In the cold press method, powder mixture is filled in a mold to form a molded product, followed by sintering. In the hot press method, powder mixture is directly sintered in a mold at normally 700 to 1000° C. for 1 to 48 hours, preferably at 800 to 950° C. for 3 to 24 hours.

In the dry, cold press method, the raw material after the pulverization is molded after drying by means of a spray dryer or the like. For the molding, a known molding method such as pressure molding, cold isostatic molding, die molding, cast molding and injection molding can be used. In order to obtain a sintered body (target) with a high sintered density, it is preferable to conduct molding by a method in which pressurizing is performed, such as the cold isostatic molding (CIP). In the molding processing, a mold aid such as polyvinyl alcohol or methyl cellulose, polywax, oleic acid or the like can be used.

Subsequently, the resulting molded product is sintered to obtain a sintered body. As for the sintering, it is preferable to conduct sintering in an oxygen atmosphere by circulating oxygen or conduct sintering under pressure. In this way, evaporation of zinc can be suppressed, whereby a sintered body having no voids can be obtained. The sintered body produced by the above-mentioned method has a high density, and hence, it can produce an oxide semiconductor film improved in film properties since it generates a less amount of nodules or particles during use.

It is preferred that, at 1000° C. or more, the temperature be elevated at 30° C./hour or higher and that the temperature be dropped at 30° C./hour or higher. If the temperature is elevated at a speed less than 30° C./hour, decomposition of an oxide may proceed to cause an increase in the number of pinholes, and if the temperature is dropped at a speed less than 30° C./hour, the composition ratio of In may be changed.

As the wet method, it is preferable to use a filtration type molding method (see JP-A-H11-286002), for example. In this filtration molding method, a filtration mold composed of a non-water-soluble material for obtaining a molded product by draining water from a ceramics raw material slurry at a reduced pressure is used. This mold is formed of a lower mold having one or more drain holes, a water-permeable filter placed on this lower mold, and a molding form which disposes this filter from the upper surface through a sealing material which seals this filter, and the lower mold; the molding form, a sealing material and the filter are assembled such that they can be deassembled. In this method, a filtration type molding mold which drains water in the slurry at a reduced pressure from only the side of a filter surface is used, a slurry composed of powder mixture, ion-exchanged water and an organic additive is prepared, this slurry is poured into the filtration type molding mold, water in the slurry is drained at a reduced pressure from only the side of the filter surface to prepare a molded product, and the resulting ceramic molded product is subjected to firing after drying and defatting.

In order to allow the bulk resistor of a sintered body obtained by the dry method or the wet method to uniformize as the whole target, it is preferable to conduct a reduction treatment. A reduction process is a process which is provided if necessary. As the applicable reduction method, reduction using a reducible gas, reduction using vacuum firing or reduction by an inert gas, etc. can be given, for example.

In the reduction step by means of a reducible gas, hydrogen, methane, carbon monoxide, a mixed gas of these gases with oxygen or the like can be used.

In the case of the reduction by firing in an inert gas, nitrogen, argon, or a mixed gas of these gases with oxygen can be used.

The temperature at the time of the reduction treatment is normally 300 to 1200° C., preferably 500 to 800° C. The time of the reduction treatment is normally 0.01 to 10 hours, preferably 0.05 to 5 hours.

An oxide sintered body becomes a target by subjecting it to a processing such as polishing. Specifically, for example, a sintered body is ground by means of a surface grinder to allow it to have a surface roughness Ra of 5 μm or less. It is preferred that the surface roughness Ra be 3 μm or less, with 0.1 μm or less being particularly preferable. Further, the sputtering surface of the target is subjected to mirror finishing to allow an average surface roughness Ra to be 1000 Å or less. This mirror finishing (polishing) can be conducted by a known polishing technology such as mechanical finishing, chemical polishing and mechanochemical polishing (combination of mechanical polishing and chemical polishing). For example, polishing may be conducted to a roughness of #2000 or more by using a fixed abrasive polisher (polishing solution: water), or, polishing may be conducted by lapping by means of a free abrasive lap (abrasive: SiC paste or the like) and then lapping by using diamond paste instead of the abrasive. There are no particular restrictions on such polishing method.

For cleaning the target, air blowing, washing with running water or the like can be used. If removal of foreign matters is performed by air blowing, foreign matters can be effectively removed by absorbing the air by means of a dust collector facing the nozzle. In addition to air blowing or washing with running water, it is possible to conduct ultrasonic cleaning or the like. In the ultrasonic cleaning, it is effective to conduct the ultrasonic cleaning by generating multiple oscillation within a frequency of 25 to 300 KHz. For example, ultrasonic cleaning may be performed by generating multiple oscillation of 12 kinds of frequencies of from 25 to 300 KHz every 25 KHz.

After processing, the resulting target was bonded to a backing plate to obtain a sputtering target which can be installed in a film-forming apparatus. It is preferred that the backing plate be formed of copper. For bonding, it is preferable to use an indium solder for bonding.

A processing step is a step provided according to need in which the sintered body obtained by sintering as mentioned above is cut and processed into a shape suited for mounting in a sputtering apparatus and for attaching a jig for bonding to a backing plate. The thickness of the target is normally 2 to 20 mm, preferably 3 to 12 mm, with 4 to 6 mm being particularly preferable. Further, a plurality of targets may be attached to one backing plate to use it as substantially one target. Moreover, it is preferable to finish the surface by means of a diamond abrasive of No. 200-10,000, and it is particularly preferable to conduct finishing by means of a diamond abrasive of No. 400-5,000. When a diamond abrasive smaller than No. 200 or larger than No. 10,000 is used, there is a possibility that a target may be broken easily.

The particle size of each compound in the target is preferably 20 μm or less, further preferably 10 μm or less, with 5 μm or less being particularly preferable. The particle size is an average particle size measured by an electron probe micro-analyzer (EPMA). The preferable crystal particle size is obtained by adjusting, for example, the amount ratio of each powder of indium oxide, gallium oxide and zinc oxide as raw materials or the particle size, the purity, the heating time, the sintering temperature, the sintering time, the sintering atmosphere and the cooling time of the raw material powder. If the particle size of the compound is larger than 20 μm, nodules may be generated during sputtering.

It is preferred that the relative density of the target be 95% or more, more preferably 98% or more, and particularly preferably 99% or more, of the theoretical density. If the density of the target is smaller than 95%, the strength may become insufficient to cause the target to be broken during the film formation. In addition, when a transistor is prepared, its performance may become non-uniform. The relative density is a density calculated relative to a theoretical density which is calculated from the weighted average. A density calculated from the weighed average of the densities of raw materials is a theoretical density, which is taken as 100%.

It is preferred that the bulk resistance of the target be 20 mΩcm or less, more preferably 10 mΩcm or less, and particularly preferably 5 mΩcm or less. If the bulk resistance is more than 20 mΩcm, when DC sputtering is conducted for film formation, the target may be broken. Moreover, spark may be generated due to abnormal discharge to cause the target to be cracked or the properties of the resulting film as an oxide semiconductor film may be deteriorated due to the adhesion of particles which have jumped out from the target by the spark to a formed film on a substrate. In addition, the target may be cracked during discharge. The bulk resistance is a value measured by the four probe method using a resistivity meter.

The transverse rupture strength of the target is preferably 8 kg/mm$^2$, more preferably 10 kg/mm$^2$, and particularly preferably 12 kg/mm$^2$. For the reason that a load may be applied during transportation and attachment to cause the target to be broken, a target is required to have a transverse rupture strength which is equal to or larger than a predetermined level. If the transverse rupture strength is less than 8 kg/mm$^2$, it may not be used as a target. The transverse rupture strength of a target can be measured according to JIS R 1601.

It is preferred that the range of variation of positive elements other than zinc in the target be within 0.5%. It is preferred that the range of variation of the density in the target be within 3%.

It is preferred that the surface roughness Ra of the target be 0.5 μm or less and that the target have an abrasive surface having no orientation. If the surface roughness Ra of the target is larger than 0.5 μm or the abrasive surface has orientation, abnormal discharge may occur or particles may be generated.

In the target, the number of pinholes with a Feret's diameter of 2 μm or more is preferably 50 or less per unit area, namely, 50/mm² or less, more preferably 20/mm² or less, with 5/mm² or less being further preferable. If the number of pinholes with a Feret's diameter of 2 μm or more per unit area is 50/mm² or more, it is not preferable since abnormal discharge tends to occur frequently from the initial stage to the last stage of the use of the target, and in addition, the smoothness of the sputtered film obtained tends to be lowered. If the number of pinholes with a Feret's diameter of 2 μm or more per unit area is 5/mm² or less, occurrence of abnormal discharge can be suppressed from the initial stage to the last stage of the use of the target, and the resulting sputtered film is very smooth. Here, the Feret's diameter means a distance between two parallel lines in a certain direction sandwiching the particle, if a pinhole is assumed to be a particle. For example, the Feret's diameter can be measured by observing an SEM image with a magnification of 100 times.

The semiconductor film of the invention is formed of an oxide containing In atoms, Sn atoms and Zn atoms, and the atomic composition ratio of Zn/(In+Sn+Zn) is 25 atom % or more and 75 atom % or less, the atomic composition ratio of Sn/(In+Sn+Zn) is less than 50 atom %, and the average valence number of Sn is +3.2 or more. The average valence number of Sn is preferably +3.6 or more, with +3.8 or more being further preferable.

The semiconductor film of the invention can be produced by forming a film by using the above-mentioned sputtering target of the invention, and can be preferably used as the semiconductor layer or the like of the field effect transistor. In addition, the average valence number of Sn is a value measured by the X-ray photoelectron spectroscopy (XPS).

EXAMPLES

Before producing a field effect transistor, an oxide semiconductor film to be served as the semiconductor layer of a transistor was formed, and thin film properties such as etching properties were evaluated.

Evaluation Example 1

(1) Production of Sputtering Target

As the raw material, powder of indium oxide, zinc oxide and tin oxide were mixed such that the atomic ratio [In/(In+Sn+Zn)] became 0.38, the atomic ratio [Sn/(In+Sn+Zn)] became 0.15 and the atomic ratio [Zn/(In+Sn+Zn)] became 0.47. The mixture was supplied to a wet type ball mill and pulverized and mixed for 72 hours to obtain raw material fine powder.

The specific surface area of the raw material powder of indium oxide, zinc oxide and tin oxide were 15 m²/g, 4 m²/g and 8 m²/g, respectively.

The resulting raw material fine powder was granulated, and press-molded into a size of 10 cm in diameter and 5 mm in thickness. The molded product was put in a firing furnace, and fired at 1400° C. for 12 hours, whereby a sintered body was obtained. The bulk resistance of the sintered body was 3 mΩcm and the theoretical relative density was 0.99. Here, the theoretical relative density was measured by calculating the ratio of the density calculated from the specific gravity of each oxide and the amount ratio of oxides to the density obtained by the Archimedian method. As a result of the analysis of the composition, the atomic ratio[In/(In+Sn+Zn)] was 0.38, the atomic ratio[Sn/(In+Sn+Zn)] was 0.15 and the atomic ratio[Zn/(In+Sn+Zn)] was 0.47, and the Na content was less than 100 ppm. As a result of the analysis of the structure by the X-ray diffraction, the sintered body contained a bixbyite structure compound and a spinel structure compound. The average particle diameter of each of the bixbyite structure compound and the spinel structure compound measured by the electron probe microanalyzer (EPMA) was 10 μm or less.

After processing and cleaning, the sintered body was bonded to a backing plate to obtain a sputtering target.

(2) Formation and Evaluation of a Thin Film

On the glass substrate (Corning 1737), a film corresponding to the semiconductor layer was formed using the target produced in (1) above and evaluated.

The sputtering conditions were as follows: Substrate temperature; 25° C., Ultimate pressure; 1×10⁻⁶ Pa, Atmospheric gas; Ar 97% and oxygen 3%, Sputtering pressure (total pressure); 5×10⁻¹ Pa, Input power; 100 W, S-T distance; 100 mm.

The resulting thin film was analyzed by the ICP method. As a result, it was found that the atomic ratio [In/(In+Sn+Zn)] was 0.40, the atomic ratio [Sn/(In+Sn+Zn)] was 0.15 and the atomic ratio [Zn/(In+Sn+Zn)] was 0.45.

In atmosphere, the above-mentioned thin films were subjected to a heat treatment at 280° C. for 1 hour.

As for the resulting thin film, the average valence number of Sn measured by XPS was +3.8 or more. Meanwhile, the average valence number can be obtained from the relative intensity of Sn in the 5s band.

Moreover, in the local structure analysis of around each of metal elements, i.e. In, Sn and Zn using the X-ray absorption fine structure (XAFS), it could be confirmed that the structure around the Sn element was similar to that of $SnO_2$, and the structure around the In and Zn elements was similar to that of the IZO thin film.

Moreover, the specific resistance was 10 Ωcm and carrier density was $10^{16}$ cm⁻³. Further, from the measurement of the temperature change by the hall effect, the thin film was confirmed to be a non-degenerate semiconductor.

Evaluation was made on the following items, and the results are shown in Table 1.

(1) Crystallinity

Films in which a hallow pattern was observed by the X-ray crystal structure analysis were judged to be amorphous.

(2) PAN Resistance

Films which were etched in PAN at a speed of 10 nm/min or more were evaluated as x and other films ware evaluated as ○.

A 40° C. PAN etching solution (87 wt % of phosphoric acid 3 wt % of nitric acid and 10 wt % of acetic acid) was used for the evaluation of PAN resistance. As the PAN etching solution (an etching solution containing phosphoric acid, nitric acid and acetic acid), a solution containing 20 to 95 wt % of phosphoric acid, 0.5 to 5 wt % of nitric acid and 3 to 50 wt % of acetic acid is normally used.

(3) Etching Properties to Oxalic Acid

The etching speed was measured by using, as an oxalic acid-based etching solution, ITO-06N (Kanto Kagaku, Inc.) of 35° C. In addition, microscopic observation was conducted after 150% over-etching to confirm the presence of residues. ○ indicates the presence of a small amount of residues and x indicates the presence of a large amount of residues.

In the evaluation of etching properties, ⊚ means excellent, ○ means good and x means poor.

(4) Dry Etching Properties

The etching speed of reactive ion etching (RIE) was measured. Films which could be etched at an etching speed of 1 nm/min or more was judged to be capable of being subjected to dry etching (○).

The target produced in Evaluation Example 18 had a bulk resistance of 2 mΩcm and a theoretical relative density of 0.99. The average valence number of Sn of a thin film obtained in the same manner as in Evaluation Example 1 was +3.8 or more.

Evaluation Examples 2 to 24

Oxide semiconductor films were formed and evaluated in the same manner as in Evaluation Example 1, except that the mixing ratio of the raw material powder and film forming conditions were changed as shown in Tables 1 to 3.

Evaluation Examples 25 to 27

Oxide semiconductor films were formed and evaluated in the same manner as in Evaluation Example 1, except that the mixing ratio and film forming conditions of the raw material powder were changed as shown in Table 3.

TABLE 1

| | | Evaluation Examples | | | | |
|---|---|---|---|---|---|---|
| | | 1 | 2 | 3 | 4 | 5 |
| Target atomic ratio | In/(In + Sn + Zn) | 0.38 | 0.33 | 0.28 | 0.28 | 0.23 |
| | Sn/(In + Sn + Zn) | 0.15 | 0.15 | 0.20 | 0.15 | 0.14 |
| | Zn/(In + Sn + Zn) | 0.47 | 0.52 | 0.52 | 0.57 | 0.63 |
| Film forming conditions | Atmospheric gas | Ar: 97% O2: 3% | Ar: 97% O2: 3% | Ar: 97% O2: 3% | Ar: 97% O2: 3% | Ar: 97% O2: 3% |
| | Total pressure [Pa] | 0.5 | 0.5 | 0.5 | 0.5 | 0.5 |
| | Oxygen partial pressure [$\times 10^{-3}$ Pa] | 15 | 15 | 15 | 15 | 15 |
| | Heat treatment temperature after film formation [° C.] | 280 | 280 | 280 | 280 | 280 |
| Film composition atomic ratio | In/(In + Sn + Zn) | 0.40 | 0.35 | 0.30 | 0.30 | 0.25 |
| | Sn/(In + Sn + Zn) | 0.15 | 0.15 | 0.20 | 0.15 | 0.15 |
| | Zn/(In + Sn + Zn) | 0.45 | 0.50 | 0.50 | 0.55 | 0.60 |
| | Composition region shown in FIG. 2 | Region1 | Region1 | Region1 | Region1 | Region1 |
| Thin film properties | Crystallinity (X-ray diffraction) | Amorphous | Amorphous | Amorphous | Amorphous | Amorphous |
| | PAN resistance | ○ | ○ | ○ | ○ | ○ |
| | Etching properties in an oxalic acid-based etching solution | ◉ | ◉ | ◉ | ○ | ○ |
| | Etching speed in an oxalic acid-based etching solution (nm/min) | 150 | 200 | 100 | 300 | 350 |
| | Residue after etching with an oxalic acid-based etching solution | ○ | ○ | ○ | ○ | ○ |
| | Suitability to dry etching | ○ | ○ | ○ | ○ | ○ |

| | | Evaluation Examples | | | | |
|---|---|---|---|---|---|---|
| | | 6 | 7 | 8 | 9 | 10 |
| Target atomic ratio | In/(In + Sn + Zn) | 0.18 | 0.14 | 0.53 | 0.43 | 0.33 |
| | Sn/(In + Sn + Zn) | 0.19 | 0.23 | 0.05 | 0.05 | 0.05 |
| | Zn/(In + Sn + Zn) | 0.63 | 0.63 | 0.42 | 0.52 | 0.63 |
| Film forming conditions | Atmospheric gas | Ar: 97% O2: 3% | Ar: 97% O2: 3% | Ar: 97% O2: 3% | Ar: 97% O2: 3% | Ar: 97% O2: 3% |
| | Total pressure [Pa] | 0.5 | 0.5 | 0.5 | 0.5 | 0.5 |
| | Oxygen partial pressure [$\times 10^{-3}$ Pa] | 15 | 15 | 15 | 15 | 15 |
| | Heat treatment temperature after film formation [° C.] | 280 | 280 | 280 | 280 | 280 |
| Film composition atomic ratio | In/(In + Sn + Zn) | 0.20 | 0.15 | 0.55 | 0.45 | 0.35 |
| | Sn/(In + Sn + Zn) | 0.20 | 0.25 | 0.05 | 0.05 | 0.05 |
| | Zn/(In + Sn + Zn) | 0.60 | 0.60 | 0.40 | 0.50 | 0.60 |
| | Composition region shown in FIG. 2 | Region1 | Region3 | Region2 | Region2 | Region2 |
| Thin film properties | Crystallinity (X-ray diffraction) | Amorphous | Amorphous | Amorphous | Amorphous | Amorphous |
| | PAN resistance | ○ | ○ | X | X | X |
| | Etching properties in an oxalic acid-based etching solution | ○ | ○ | ○ | ○ | ○ |
| | Etching speed in an oxalic acid-based etching solution (nm/min) | 200 | 100 | 200 | 300 | 400 |

TABLE 1-continued

|  |  |  |  |  |  |
|---|---|---|---|---|---|
| Residue after etching with an oxalic acid-based etching solution | ○ | ○ | ○ | ○ | ○ |
| Suitability to dry etching | ○ | ○ | ○ | ○ | ○ |

TABLE 2

| | | Evaluation Examples | | | | | | | |
|---|---|---|---|---|---|---|---|---|---|
| | | 11 | 12 | 13 | 14 | 15 | 16 | 17 | 18 |
| Target atomic ratio | In/(In + Sn + Zn) | 0.12 | 0.34 | 0.24 | 0.34 | 0.24 | 0.15 | 0.05 | 0.35 |
| | Sn/(In + Sn + Zn) | 0.13 | 0.24 | 0.24 | 0.34 | 0.34 | 0.33 | 0.32 | 0.15 |
| | Zn/(In + Sn + Zn) | 0.73 | 0.42 | 0.52 | 0.32 | 0.42 | 0.52 | 0.63 | 0.50 |
| Film forming conditions | Atmospheric gas | Ar: 97% O2: 3% | Ar: 97% O2: 3% | Ar: 97% O2: 3% | Ar: 97% O2: 3% | Ar: 97% O2: 3% | Ar: 97% O2: 3% | Ar: 97% O2: 3% | Ar: 97% O2: 3% |
| | Total pressure [Pa] | 0.5 | 0.5 | 0.5 | 0.5 | 0.5 | 0.5 | 0.5 | 0.5 |
| | Oxygen partial pressure [×$10^{-3}$ Pa] | 15 | 15 | 15 | 15 | 15 | 15 | 15 | 15 |
| | Heat treatment temperature after film formation [° C.] | 280 | 280 | 280 | 280 | 280 | 280 | 280 | 280 |
| Film composition atomic ratio | In/(In + Sn + Zn) | 0.15 | 0.35 | 0.25 | 0.35 | 0.25 | 0.15 | 0.05 | 0.37 |
| | Sn/(In + Sn + Zn) | 0.15 | 0.25 | 0.25 | 0.35 | 0.35 | 0.35 | 0.35 | 0.15 |
| | Zn/(In + Sn + Zn) | 0.70 | 0.40 | 0.50 | 0.30 | 0.40 | 0.50 | 0.60 | 0.48 |
| | Composition region shown in FIG. 2 | Region4 | Outside the region | Region3 | Outside the region | Outside the region | Outside the region | Outside the region | Region1 |
| Thin film properties | Crystallinity (X-ray diffraction) | Amorphous | Amorphous | Amorphous | Amorphous | Amorphous | Amorphous | Amorphous | Amorphous |
| | PAN resistance | ○ | ○ | ○ | ○ | ○ | ○ | ○ | ○ |
| | Etching properties in an oxalic acid-based etching solution | Δ | Δ | X | X | X | X | X | ◎ |
| | Etching speed in an oxalic acid-based etching solution (nm/min) | 600 | 40 | <10 | <10 | <10 | <10 | <10 | 170 |
| | Residue after etching with an oxalic acid-based etching solution | ○ | ○ | X | X | X | X | X | ○ |
| | Suitability to dry etching | ○ | ○ | ○ | ○ | ○ | ○ | ○ | ○ |

TABLE 3

| | | Evaluation Examples | | | | |
|---|---|---|---|---|---|---|
| | | 19 | 20 | 21 | 22 | 23 |
| Target atomic ratio | In/(In + Sn + Zn) | 0.14 | 0.18 | 0.23 | 0.33 | 0.38 |
| | Sn/(In + Sn + Zn) | 0.23 | 0.19 | 0.14 | 0.05 | 0.15 |
| | Zn/(In + Sn + Zn) | 0.63 | 0.63 | 0.63 | 0.63 | 0.47 |
| Film forming conditions | Atmospheric gas | Ar: 97% O2: 3% | Ar: 97% O2: 3% | Ar: 97% O2: 3% | Ar: 97% O2: 3% | Ar: 99% O2: 1% |
| | Total pressure [Pa] | 0.5 | 0.5 | 0.5 | 0.5 | 0.5 |
| | Oxygen partial pressure [×$10^{-3}$ Pa] | 15 | 15 | 15 | 15 | 5 |
| | Heat treatment temperature after film formation [° C.] | 200 | 200 | 350 | 350 | 280 |
| Film composition atomic ratio | In/(In + Sn + Zn) | 0.15 | 0.20 | 0.25 | 0.35 | 0.40 |
| | Sn/(In + Sn + Zn) | 0.25 | 0.20 | 0.15 | 0.05 | 0.15 |
| | Zn/(In + Sn + Zn) | 0.60 | 0.60 | 0.60 | 0.60 | 0.45 |
| | Composition region shown in FIG. 2 | Region3 | Region1 | Region1 | Region2 | Region1 |
| Thin film properties | Crystallinity (X-ray diffraction) | Amorphous | Amorphous | Amorphous | Amorphous | Amorphous |
| | PAN resistance | ○ | ○ | ○ | X | ○ |
| | Etching properties in an oxalic acid-based etching solution | ○ | ○ | ○ | ○ | ◎ |
| | Etching speed in an oxalic acid-based etching solution (nm/min) | 100 | 200 | 350 | 400 | 150 |

TABLE 3-continued

| | | Evaluation Examples | | | |
|---|---|---|---|---|---|
| | | | | | |
| | Residue after etching with an oxalic acid-based etching solution | ○ | ○ | ○ | ○ | ○ |
| | Suitability to dry etching | ○ | ○ | ○ | ○ | ○ |

| | | Evaluation Examples | | | |
|---|---|---|---|---|---|
| | | 24 | 25 | 26 | 27 |
| Target atomic ratio | In/(In + Sn + Zn) | 0.38 | 0.25 | 0.25 | 0.20 |
| | Sn/(In + Sn + Zn) | 0.15 | 0.14 | 0.10 | 0.14 |
| | Zn/(In + Sn + Zn) | 0.47 | 0.61 | 0.65 | 0.66 |
| Film forming conditions | Atmospheric gas | Ar: 95% O2: 5% | Ar: 95% O2: 5% | Ar: 95% O2: 5% | Ar: 95% O2: 5% |
| | Total pressure [Pa] | 0.5 | 0.4 | 0.4 | 0.4 |
| | Oxygen partial pressure [×10$^{-3}$ Pa] | 25 | 20 | 20 | 20 |
| | Heat treatment temperature after film formation [° C.] | 280 | 280 | 280 | 280 |
| Film composition atomic ratio | In/(In + Sn + Zn) | 0.40 | 0.25 | 0.25 | 0.20 |
| | Sn/(In + Sn + Zn) | 0.15 | 0.14 | 0.10 | 0.14 |
| | Zn/(In + Sn + Zn) | 0.45 | 0.61 | 0.65 | 0.66 |
| | Composition region shown in FIG. 2 | Region1 | Region1 | Region1 | Region1 |
| Thin film properties | Crystallinity (X-ray diffraction) | Amorphous | Amorphous | Amorphous | Amorphous |
| | PAN resistance | ○ | ○ | ○ | ○ |
| | Etching properties in an oxalic acid-based etching solution | ◎ | ○ | ○ | ○ |
| | Etching speed in an oxalic acid-based etching solution (nm/min) | 150 | 350 | 350 | 350 |
| | Residue after etching with an oxalic acid-based etching solution | ○ | ○ | ○ | ○ |
| | Suitability to dry etching | ○ | ○ | ○ | ○ |

[Fabrication of Field Effect Transistor]

Examples 1 to 17

An etch-stopper (ES) type field effect transistor with a bottom-gate structure shown in FIG. 1 was fabricated. The production process will be explained below with reference to the drawings.

Figure 3A:
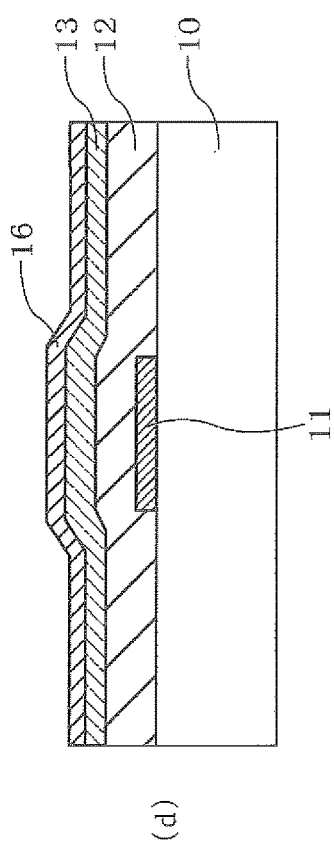
FIG. 3a is a view showing the manufacturing steps of the field effect transistor fabricated in Example 1.
Figure 3A:
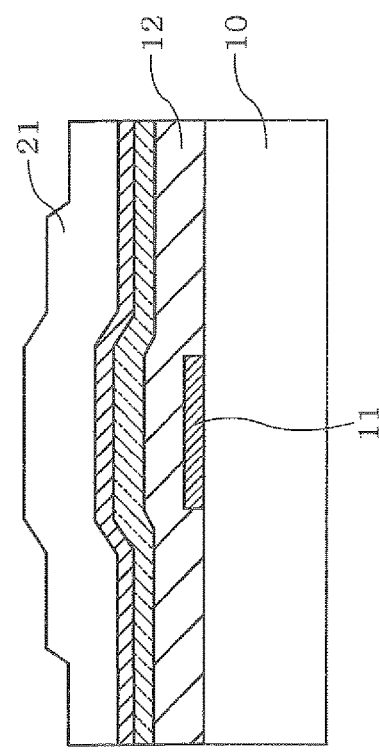
Figure 3A:
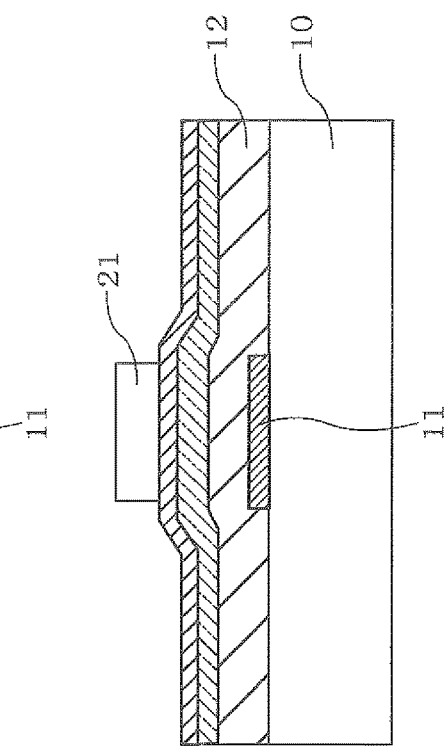
Figure 3A:
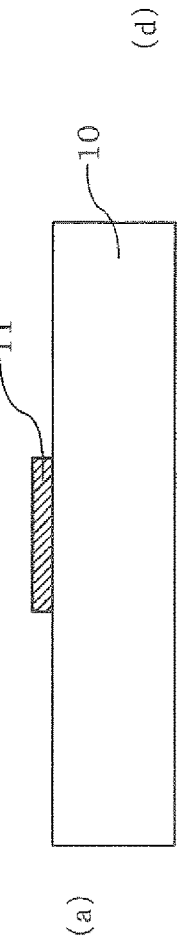
Figure 3A:
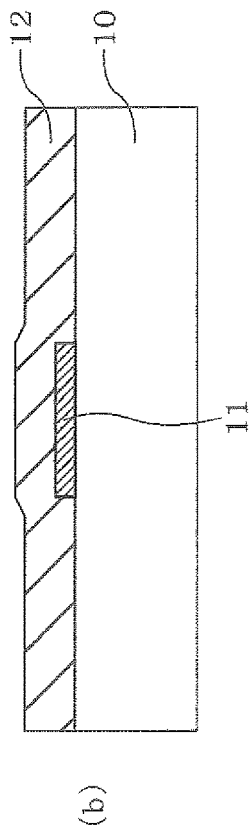
Figure 3A:
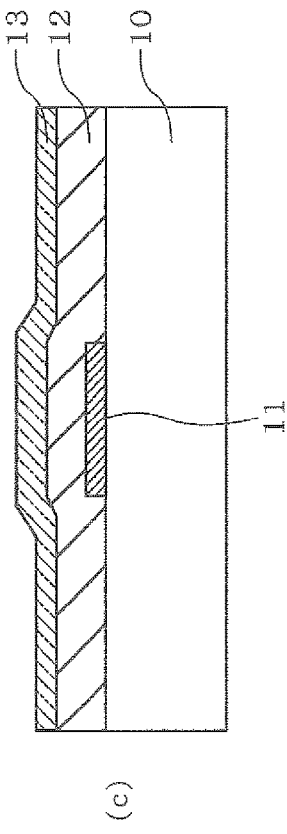

FIGS. 3a and 3b each show the steps of producing the field effect transistor.

On a glass substrate 10, metal molybdenum was formed in a thickness of 200 nm by RF sputtering at room temperature, followed by patterning by wet etching to prepare a gate electrode 11 (FIG. 3a(a)).

Next, by a plasma-enhanced chemical vapor deposition (PECVD) apparatus, SiOx was formed into a film on the substrate on which the gate electrode 11 was provided, thereby to form a gate insulating film 12 (FIG. 3a(b)).

Next, the targets for a semiconductor layer produced in Evaluation Examples 1 to 17 were mounted in a film-forming apparatus of the DC magnetron sputtering method, which is one of the DC sputtering methods, and a semiconductor layer 13 (film thickness: 30 nm) was formed on the gate insulating film 12 (FIG. 3a(c)). The sputtering conditions were the same as those in the above-mentioned Evaluation Examples.

Subsequently, a heat treatment was conducted at 280° C. for one hour (the same condition as that of a heat treatment conducted after the formation of the protective layer, which will be mentioned later).

Subsequently, SiOx was formed into a film by PECVD to form a thin film 16 (FIG. 3a(d)). Then, a resist film 21 was formed (FIG. 3a(e)), followed by patterning (FIG. 3a(f)).

The thin film 16 was patterned by dry etching (RIE) to form a first protective layer 16 (etch stopper) (FIG. 3b(g)).

The resist film 21 was removed (FIG. 3b(h)). Thereafter, a thin film 22 which will be a source electrode and a drain electrode was formed (FIG. 3b(i)). The thin film 22 was allowed to be a Ti/Al/Ti stacked film by DC sputtering. After the film formation, patterning was conducted by dry etching (RIE) to form a source electrode 14 and a drain electrode 15. Simultaneously, the semiconductor layer 13 was etched (FIG. 3b(j)).

Further, SiNx was formed into a film by PECVD (PECVD SiNx:H), thereby to form a second protective layer 17 (FIG. 3b(k)). A contact hole 18 was formed for the connection with an external wiring.

Thereafter, in an atmosphere, a heat treatment was conducted at 280° C. for one hour, whereby an etch-stopper type field effect transistor with a bottom gate structure having a width (W) of 20 μm and a length (L) of 5 μm (FIG. 3b(l)) was produced.

For the field effect transistor, the following evaluation was conducted.
(1) Field Effect Mobility (μ), On-Off Ratio, Off Current, S Value, and Threshold Voltage (Vth)

Using a semiconductor parameter analyzer (Keithley 4200), measurement was conducted at room temperature and in a light-shielded environment.
(2) Hysteresis Using a semiconductor parameter analyzer, a transmission curve at the time of increasing the voltage (I-V characteristics) and a transmission curve at the time of decreasing the voltage (I-V characteristics) were obtained, and a difference in voltage between when the voltage was increased and when the voltage was decreased was taken as ΔVg. A transistor having a maximum ΔVg value of 0.5 V or less was evaluated as "slight", a transistor having a maximum ΔVg value of 0.5 to 3 V was evaluated as "substantial" and a transistor having a maximum ΔVg value of 3 V or more was evaluated as "significant".

Figure 4:
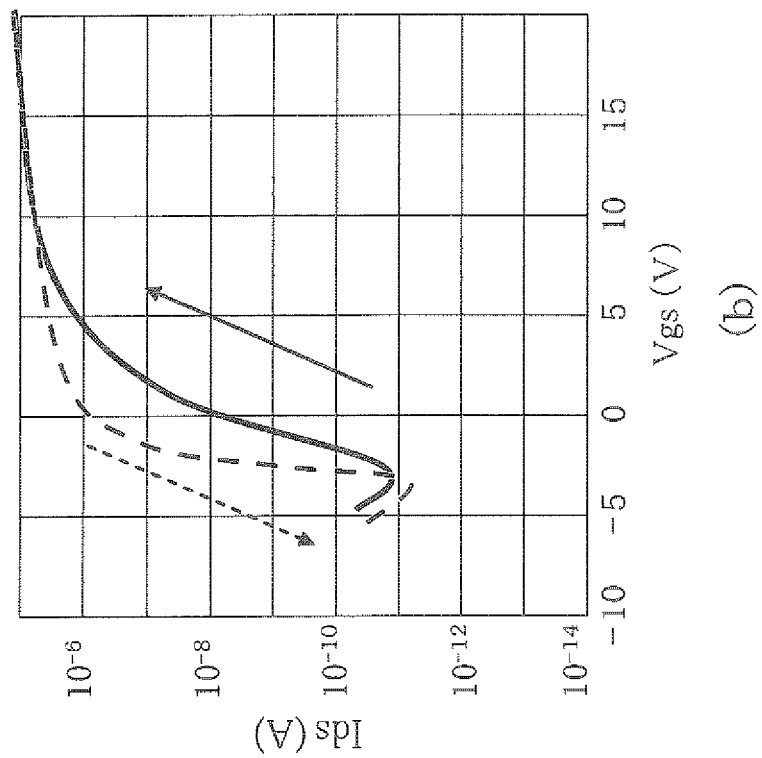
FIG. 4 is an example of the transmission curve at the time of increasing the voltage and at the time of decreasing the voltage (I-V characteristic), in which (a) shows an example with small hysteresis, and (b) shows an example with significant hysteresis.
Figure 4:
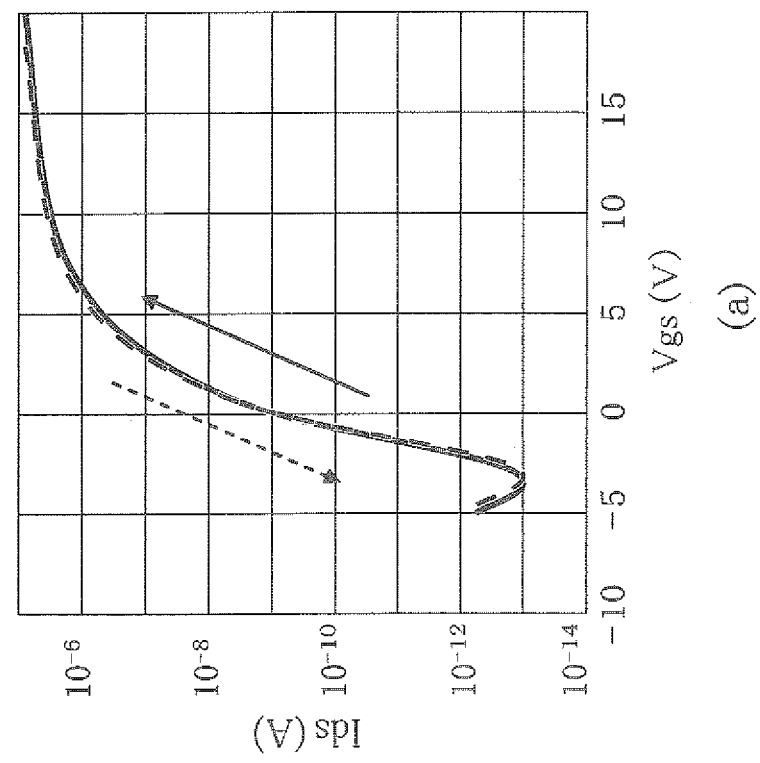

FIG. 4 shows an example of a transmission curve at the time of increasing the voltage and at the time of decreasing the voltage (I-V characteristics), in which (a) shows an example suffering only slight hysteresis and (b) shows an example suffering significant hysteresis.

(3) Shift Amount in Threshold Voltage (Stress Test)

As the stress conditions, a 10 μA-DC voltage was applied at a gate voltage of 20 V at 50° C. for $10^5$ seconds. The Vth value before and after the application of a stress was compared to measure the amount of shift in threshold voltage (ΔVth).

(4) Moisture Resistance

The transistor was allowed to stand at a humidity of 85% for 120 hours to evaluate a shift in threshold voltage.
⊚: Shift amount was less than 0.5 V
○: Shift amount was 0.5 V or more and less than 2 V
Δ: Shift amount was 2 V or more and 5 V or less
x: Shift amount was 5 V or more For Example 1 and Examples 2 to 39 in which the transistors having the same shape as that in Example 1 were produced, the device structure of the field effect transistor is shown in Tables 4 to 6. Further, the results of evaluation are shown in Tables 7 and 8.

TABLE 4

| | | Examples | | | |
|---|---|---|---|---|---|
| | | 1-17 | 18 | 19 | 20 |
| Structure of TFT Film forming method | Type | Bottom gate etch stopper | Bottom gate etch stepper | Bottom gate etch stopper | Bottom gate etch stopper |
| | Channel width W (μm) | 20 | 20 | 20 | 20 |
| | Channel length L (μm) | 5 | 5 | 5 | 5 |
| | Thickness of semiconductor layer | 30 | 30 | 30 | 30 |
| | Gate insulating film | PECVD SiOx | PECVD SiOx | PECVD SiOx | PECVD SiOx |
| | Source/drain (S/D) electrodes | Ti/Al/Ti | Ti/Al/Ti | Ti/Al/Ti | Ti/Al/Ti |
| | First protective layer | PECVD SiOx | PECVD SiOx | PECVD SiOx | PECVD SiOx |
| | Second protective layer | PECVD SiNx | PECVD SiNx | PECVD SiNx | PECVD SiNx |
| TFT production process | Kind of semiconductor layer | Evaluation Ex. 1-17 | Evaluation Ex. 19 | Evaluation Ex. 20 | Evaluation Ex. 21 |
| | Patterning  Formation of semiconductor layer | Dry etching | Dry etching | Dry etching | Dry etching |
| | Formation of S/D electrodes | Dry etching | Dry etching | Dry etching | Dry etching |
| | Heat treatment conditions after formation of protective layer | 280° C., 1 h | 200° C., 1 h | 200° C., 1 h | 200° C., 1 h |

| | | Examples | | | |
|---|---|---|---|---|---|
| | | 21 | 22 | 23 | 24 |
| Structure of TFT Film forming method | Type | Bottom gate etch stopper | Bottom gate etch stopper | Bottom gate etch stopper | Bottom gate etch stopper |
| | Channel width W (μm) | 20 | 20 | 20 | 20 |
| | Channel length L (μm) | 5 | 5 | 5 | 5 |
| | Thickness of semiconductor layer | 30 | 30 | 30 | 30 |
| | Gate insulating film | PECVD SiOx | PECVD SiOx | PECVD SiOx | PECVD SiOx |
| | Source/drain (S/D) electrodes | Ti/Al/Ti | Ti/Al/Ti | Ti/Al/Ti | Ti/Al/Ti |
| | First protective layer | PECVD SiOx | PECVD SiOx | PECVD SiOx | PECVD SiOx |
| | Second protective layer | PECVD SiNx | PECVD SiNx | PECVD SiNx | PECVD SiNx |
| TFT production process | Kind of semiconductor layer | Evaluation Ex. 22 | Evaluation Ex. 19 | Evaluation Ex. 20 | Evaluation Ex. 21 |
| | Patterning  Formation of semiconductor layer | Dry etching | Dry etching | Dry etching | Dry etching |
| | Formation of S/D electrodes | Dry etching | Dry etching | Dry etching | Dry etching |
| | Heat treatment conditions after formation of protective layer | 200° C., 1 h | 350° C., 1 h | 350° C., 1 h | 350° C., 1 h |

TABLE 5

| | | Examples | | | | | | | |
|---|---|---|---|---|---|---|---|---|---|
| | | 25 | 26 | 27 | 28 | 29 | 30 | 31 | 32 |
| Structure of TFT Film forming method | Type | Bottom gate etch stopper | Bottom gate etch stopper | Bottom gate etch stopper | Bottom gate etch stopper | Bottom gate etch stopper | Bottom gate etch stopper | Bottom gate etch stopper | Bottom gate etch stopper |
| | Channel width W (μm) | 20 | 20 | 20 | 20 | 20 | 20 | 20 | 20 |
| | Channel length L (μm) | 5 | 5 | 5 | 5 | 5 | 5 | 5 | 5 |
| | Thickness of semiconductor layer | 30 | 30 | 30 | 30 | 30 | 30 | 30 | 30 |

TABLE 5-continued

|  |  | Examples | | | | | | | |
|---|---|---|---|---|---|---|---|---|---|
|  |  | 25 | 26 | 27 | 28 | 29 | 30 | 31 | 32 |
|  | Gate insulating film | PECVD SiOx | PECVD SiOx | PECVD SiOx | PECVD SiOx | PECVD SiOx | PECVD SiOx | PECVD SiOx | PECVD SiOx |
|  | Source/drain (S/D) electrodes | Ti/Al/Ti | Al—Nd alloy | Al—Nd alloy | Al—Nd alloy | Al—Nd alloy | Al—Nd alloy | Al—Nd alloy | Al—Nd alloy |
|  | First protective layer | PECVD SiOx | PECVD SiOx | PECVD SiOx | PECVD SiOx | PECVD SiOx | PECVD SiOx | PECVD SiOx | PECVD SiOx |
|  | Second protective layer | PECVD SiNx | PECVD SiNx | PECVD SiNx | PECVD SiNx | PECVD SiNx | PECVD SiNx | PECVD SiNx | PECVD SiNx |
| TFT fabrication process | Kind of semiconductor layer | Evaluation Ex. 22 | Evaluation Ex. 1 | Evaluation Ex. 2 | Evaluation Ex. 3 | Evaluation Ex. 4 | Evaluation Ex. 5 | Evaluation Ex. 6 | Evaluation Ex. 7 |
|  | Patterning Formation of semiconductor layer | Dry etching | Wet etching | Wet etching | Wet etching | Wet etching | Wet etching | Wet etching | Wet etching |
|  | Formation of S/D electrodes | Dry etching | Wet etching | Wet etching | Wet etching | Wet etching | Wet etching | Wet etching | Wet etching |
|  | Heat treatment conditions after formation of protective layer | 350° C., 1 h | 280° C., 1 h | 280° C., 1 h | 280° C., 1 h | 280° C., 1 h | 280° C., 1 h | 280° C., 1 h | 280° C., 1 h |

TABLE 6

|  |  | Examples | | | | | | |
|---|---|---|---|---|---|---|---|---|
|  |  | 33 | 34 | 35 | 36 | 37 | 38 | 39 |
| Structure of TFT | Type | Bottom gate etch stopper | Bottom gate etch stopper | Bottom gate etch stopper | Bottom gate etch stopper | Bottom gate etch stopper | Bottom gate etch stopper | Bottom gate etch stopper |
| Film forming method | Channel width W (μm) | 20 | 20 | 20 | 20 | 20 | 20 | 20 |
|  | Channel length L (μm) | 5 | 5 | 5 | 5 | 5 | 5 | 5 |
|  | Thickness of semiconductor layer | 30 | 30 | 30 | 15 | 60 | 30 | 30 |
|  | Gate insulating film | PECVD SiOx | PECVD SiNx | PECVD SiOx | PECVD SiOx | PECVD SiOx | PECVD SiOx | PECVD SiOx |
|  | Source/drain (S/D) electrodes | Al—Nd Alloy | Al—Nd Alloy | Ti/Al/Ti | Ti/Al/Ti | Ti/Al/Ti | Ti/Al/Ti | Ti/Al/Ti |
|  | First protective layer | PECVD SiOx | PECVD SiOx | PECVD SiOx | PECVD SiOx | PECVD SiOx | PECVD SiOx | PECVD SiOx |
|  | Second protective layer | PECVD SiNx | PECVD SiNx | None | PECVD SiNx | PECVD SiNx | PECVD SiNx | PECVD SiNx |
| TFT production process | Kind of semiconductor layer | Evaluation Ex. 18 | Evaluation Ex. 18 | Evaluation Ex. 2 | Evaluation Ex. 1 | Evaluation Ex. 1 | Evaluation Ex. 23 | Evaluation Ex. 24 |
|  | Patterning Formation of semiconductor layer | Wet etching | Wet etching | Dry etching | Dry etching | Dry etching | Dry etching | Dry etching |
|  | Formation of S/D electrodes | Wet etching | Wet etching | Dry etching | Dry etching | Dry etching | Dry etching | Dry etching |
|  | Conditions of heat treatment after formation of protective layer | 280° C., 1 h | 280° C., 1 h | 280° C., 1 h | 280° C., 1 h | 280° C., 1 h | 280° C., 1 h | 280° C., 1 h |

TABLE 7

|  |  | Examples | | | | | | | | | |
|---|---|---|---|---|---|---|---|---|---|---|---|
|  |  | 1 | 2 | 3 | 4 | 5 | 6 | 7 | 8 | 9 | 10 |
|  | Kind of semiconductor | Evaluation Ex. 1 | Evaluation Ex. 2 | Evaluation Ex. 3 | Evaluation Ex. 4 | Evaluation Ex. 5 | Evaluation Ex. 6 | Evaluation Ex. 7 | Evaluation Ex. 8 | Evaluation Ex. 9 | Evaluation Ex. 10 |
| TFT properties | Mobility (cm$^2$/Vs) | 25 | 25 | 25 | 23 | 23 | 20 | 16 | 16 | 17 | 18 |
|  | On off ratio | $10^{10}$ | $10^{10}$ | $10^{10}$ | $10^{10}$ | $10^{10}$ | $10^{10}$ | $10^{10}$ | $10^9$ | $10^{10}$ | $10^{10}$ |
|  | Off current (pA) | 0.01 | 0.01 | 0.01 | 0.01 | 0.01 | 0.01 | 0.01 | 0.1 | 0.05 | 0.03 |
|  | S value | 0.1 | 0.1 | 0.1 | 0.1 | 0.1 | 0.1 | 0.1 | 0.3 | 0.2 | 0.2 |
|  | Vth (V) | 0.1 | 0.1 | 0.1 | 0.2 | 0.2 | 0.5 | 1 | −0.1 | 0 | 0.1 |
|  | Hysteresis | Slight | Slight | Slight | Slight | Slight | Slight | Slight | Slight | Slight | Slight |

TABLE 7-continued

| | | | | | | | | | | | |
|---|---|---|---|---|---|---|---|---|---|---|---|
| TFT reliability | Shift in threshold voltage Δ Vth (V) | 0.3 | 0.3 | 0.4 | 0.5 | 0.5 | 0.5 | 0.8 | 0.5 | 0.5 | 0.5 |
| | Moisture resistance | ◎ | ◎ | ◎ | ◎ | ◎ | ◎ | ◎ | ◎ | ◎ | ◎ |

| | | Examples | | | | | | | | | |
|---|---|---|---|---|---|---|---|---|---|---|---|
| | | 11 | 12 | 13 | 14 | 15 | 16 | 17 | 18 | 19 | 20 |
| Conditions of semiconductor layer | | Evaluation Ex. 11 | Evaluation Ex. 12 | Evaluation Ex. 13 | Evaluation Ex. 14 | Evaluation Ex. 15 | Evaluation Ex. 16 | Evaluation Ex. 17 | Evaluation Ex. 19 | Evaluation Ex. 20 | Evaluation Ex. 21 |
| TFT properties | Mobility ($cm^2$/Vs) | 15 | 14 | 15 | 12 | 10 | 8 | 6 | 5 | 13 | 16 |
| | On off ratio | $10^{10}$ | $10^9$ | $10^{10}$ | $10^9$ | $10^9$ | $10^9$ | $10^9$ | $10^{10}$ | $10^{10}$ | $10^{10}$ |
| | Off current (pA) | 0.01 | 2 | 0.1 | 1 | 0.1 | 0.05 | 0.03 | 1 | 0.05 | 0.02 |
| | S value | 0.1 | 0.3 | 0.4 | 0.5 | 0.5 | 0.5 | 0.5 | 0.1 | 0.1 | 0.1 |
| | Vth (V) | 1.5 | 1 | 0.5 | 1 | 1 | 1 | 2 | 1.5 | 0.8 | 0.7 |
| | Hysteresis | Slight | Slight | Slight | Slight | Slight | Slight | Slight | Slight | Slight | Slight |
| TFT reliability | Shift in threshold voltage Δ Vth (V) | 0.5 | 0.8 | 0.8 | 2 | 2 | 2 | 2 | 1.8 | 0.8 | 0.7 |
| | Moisture resistance | ◎ | ◎ | ◎ | ◎ | ◎ | ◎ | ◎ | ◎ | ◎ | ◎ |

| | | Examples | | | | | | | | | |
|---|---|---|---|---|---|---|---|---|---|---|---|
| | | 21 | 22 | 23 | 24 | 25 | 26 | 27 | 28 | 29 | 30 |
| Conditions of semiconductor layer | | Evaluation Ex. 22 | Evaluation Ex. 19 | Evaluation Ex. 20 | Evaluation Ex. 21 | Evaluation Ex. 22 | Evaluation Ex. 1 | Evaluation Ex. 2 | Evaluation Ex. 3 | Evaluation Ex. 4 | Evaluation Ex. 5 |
| TFT properties | Mobility ($cm^2$/Vs) | 17 | 25 | 22 | 21 | 18 | 25 | 25 | 25 | 23 | 26 |
| | On off ratio | $10^{10}$ | $10^{10}$ | $10^{10}$ | $10^{10}$ | $10^{10}$ | $10^{10}$ | $10^{10}$ | $10^{10}$ | $10^{10}$ | $10^{10}$ |
| | Off current (pA) | 0.01 | 0.01 | 0.02 | 0.03 | 0.05 | 0.01 | 0.01 | 0.01 | 0.01 | 0.01 |
| | S value | 0.1 | 0.1 | 0.1 | 0.1 | 0.2 | 0.1 | 0.1 | 0.1 | 0.1 | 0.1 |
| | Vth (V) | 0.5 | 0.2 | 0.2 | 0.2 | 0.1 | 0.1 | 0.1 | 0.1 | 0.2 | 0.1 |
| | Hysteresis | Slight | Slight | Slight | Slight | Slight | Slight | Slight | Slight | Slight | Slight |
| TFT reliability | Shift in threshold voltage Δ Vth (V) | 0.6 | 0.3 | 0.4 | 0.5 | 0.5 | 0.3 | 0.3 | 0.3 | 0.3 | 0.1 |
| | Moisture resistance | ◎ | ◎ | ◎ | ◎ | ◎ | ◎ | ◎ | ◎ | ◎ | ◎ |

TABLE 8

| | | Examples | | | | | | | | |
|---|---|---|---|---|---|---|---|---|---|---|
| | | 31 | 32 | 33 | 34 | 35 | 36 | 37 | 38 | 39 |
| Conditions of semiconductor layer | | Evaluation Ex. 6 | Evaluation Ex. 7 | Evaluation Ex. 18 | Evaluation Ex. 18 | Evaluation Ex. 2 | Evaluation Ex. 1 | Evaluation Ex. 1 | Evaluation Ex. 23 | Evaluation Ex. 24 |
| TFT properties | Mobility ($cm^2$/Vs) | 20 | 16 | 20 | 20 | 24 | 25 | 19 | 25 | 23 |
| | On off ratio | $10^{10}$ | $10^{10}$ | $10^{10}$ | $10^{10}$ | $10^{10}$ | $10^{10}$ | $10^{10}$ | $10^9$ | $10^{10}$ |
| | Of current (pA) | 0.01 | 0.01 | 0.01 | 0.01 | 0.01 | 0.01 | 0.01 | 0.1 | 0.01 |
| | S value | 0.1 | 0.1 | 0.1 | 0.1 | 0.1 | 0.1 | 0.3 | 0.3 | 0.1 |
| | Vth (V) | 0.5 | 1 | 0.1 | 0.1 | 0.1 | 1 | −0.3 | −0.1 | 0.8 |
| | Hysteresis | Slight | Slight | Slight | Slight | Slight | Slight | Slight | Slight | Slight |
| TFT reliability | Shift in threshold voltage Δ Vth (V) | 0.5 | 0.8 | 0.3 | 0.3 | 0.4 | 0.3 | 0.3 | 0.8 | 0.2 |
| | Moisture resistance | ◎ | ◎ | ◎ | ◎ | ○ | ◎ | ◎ | ◎ | ◎ |

Examples 18 to 25

Transistors were fabricated and evaluated in the same manner as in Example 1, except that the semiconductor layer was formed at the same conditions as those in Evaluation Examples shown in Tables 4 and 5. The results are shown in Table 7.

Examples 26 to 32

Transistors were fabricated and evaluated in the same manner as in Example 1, except that the formation of the semiconductor layer and the source/drain electrodes were changed as shown in Tables 4 and 5, and the formation of the semiconductor layer and the formation of the source/drain electrodes were conducted by wet etching.

The semiconductor layer was patterned by using an oxalic acid-based etching solution, and the source electrode and the drain electrode were patterned by using a PAN-based etching solution.

Examples 33 and 34

Transistors were fabricated and evaluated in the same manner as in Example 1, except that the structure and the TFT fabrication process of the TFT were changed as shown in Table 6.

Examples 35 to 37

Transistors were fabricated and evaluated in the same manner as in Example 1, except that the TFT structure and the TFT fabrication process of the TFT were changed as shown in Table 6.

Examples 38 and 39

Transistors were fabricated and evaluated in the same manner as in Example 1, except that the oxygen partial pressure at the time of forming the semiconductor layer was changed as shown in Table 6.

Example 40

Figure 5:
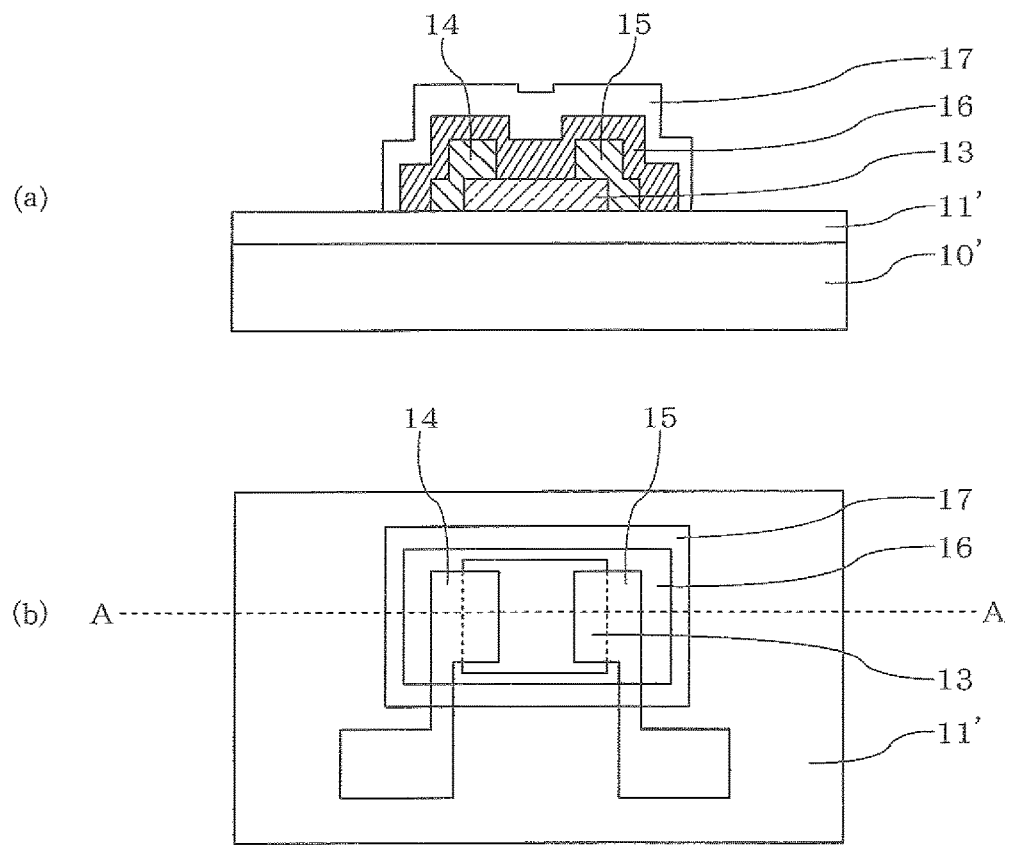
FIG. 5(a) is a schematic cross-sectional view of the etch-stopper type field effect transistor with a bottom gate structure produced in Example 40.
FIG. 5(b) is a schematic view of the upper surface of the transistor.

An etch-stopper type field effect transistor with a bottom gate structure shown in FIG. 5 was fabricated and evaluated in the same manner as in Example 1. FIG. 5(a) is a schematic cross-sectional view of the field-effect transistor fabricated in Example 40, and (b) is a schematic view of the upper surface of the transistor, showing the positional relationship of each element. FIG. 5(a) is a cross-sectional view taken along the line A-A in FIG. 5(b). The same elements as those shown in FIG. 1 are indicated by the same numerals, and an explanation thereof is omitted.

In this example, an Si substrate 10' with an thermally oxidized film 11' (SiOx, 100 nm) was used, and the transistor was fabricated with the TFT structure and by the TFT fabrication process which are the same as those shown in Table 9. In this transistor, the Si substrate 10' also served as a gate electrode.

For Examples 40 and 41 to 46 in which the transistors having the same shape as that in Example 40 were produced, the device structure of the field effect transistor is shown in Table 9.

Further, the results of evaluation are shown in Table 10.

TABLE 9

|  |  | Examples | | | | | | |
| --- | --- | --- | --- | --- | --- | --- | --- | --- |
|  |  | 40 | 41 | 42 | 43 | 44 | 45 | 46 |
| Structure of TFT Film forming method | Type | Bottom gate (Si substrate) etch stopper | Bottom gate (Si substrate) etch stopper | Bottom gate (Si substrate) etch stopper | Bottom gate (Si substrate) etch stopper | Bottom gate (Si substrate) etch stopper | Bottom gate (Si substrate) etch stopper | Bottom gate (Si substrate) etch stopper |
|  | Channel width W (μm) | 20 | 20 | 20 | 20 | 20 | 20 | 20 |
|  | Channel length L (μm) | 5 | 5 | 5 | 5 | 5 | 5 | 5 |
|  | Thickness of semiconductor layer | 30 | 30 | 30 | 30 | 30 | 30 | 30 |
|  | Gate insulating film | Thermally oxidized film SiOx | Thermally oxidized film SiOx | Thermally oxidized film SiOx | Thermally oxidized film SiOx | Thermally oxidized film SiOx | Thermally oxidized film SiOx | Thermally oxidized film SiOx |
|  | Source/drain (S/D) electrodes | Al—Nd Alloy | Al—Nd Alloy | Al—Nd Alloy | Al—Nd Alloy | Mo | Ti/Al/Ti | Al—Nd Alloy |
|  | First protective layer | RF sputtering SiOx | RF sputtering HfOx | RF sputtering SiOx | RF sputtering SiOx | RF sputtering SiOx | RF sputtering SiOx | RF sputtering SiOx |
|  | Second protective layer | PECVD SiNx | PECVD SiNx | None | PECVD SiNx | PECVD SiNx | PECVD SiNx | PECVD SiNx |
| TFT fabrication process | Kind of semiconductor layer | Evaluation Ex. 18 | Evaluation Ex. 18 | Evaluation Ex. 18 | Evaluation Ex. 18 | Evaluation Ex. 18 | Evaluation Ex. 18 | Evaluation Ex. 18 |
|  | Patterning Formation of semiconductor layer | Wet etching | Wet etching | Wet etching | Wet etching | Wet etching | Wet etching | Wet etching |
|  | Formation of S/D electrodes | Wet etching | Wet etching | Wet etching | Lift off | Lift off | Lift off | Dry etching |
|  | Conditions of heat treatment after formation of protective layer | 280° C., 1 h | 280° C., 1 h | 280° C., 1 h | 280° C., 1 h | 280° C., 1 h | 280° C., 1 h | 280° C., 1 h |

TABLE 10

|  |  | Examples | | | | | | |
| --- | --- | --- | --- | --- | --- | --- | --- | --- |
|  |  | 40 | 41 | 42 | 43 | 44 | 45 | 46 |
| Conditions of semiconductor layer | | Evaluation Ex. 18 | Evaluation Ex. 18 | Evaluation Ex. 18 | Evaluation Ex. 18 | Evaluation Ex. 18 | Evaluation Ex. 18 | Evaluation Ex. 18 |
| TFT properties | Mobility (cm²/Vs) | 12 | 14 | 11 | 12 | 11 | 15 | 12 |
|  | On off ratio | $10^9$ | $10^9$ | $10^9$ | $10^9$ | $10^9$ | $10^9$ | $10^9$ |
|  | Off current (pA) | 0.1 | 0.1 | 0.1 | 0.1 | 0.1 | 0.1 | 0.1 |
|  | S value | 0.6 | 0.4 | 0.9 | 0.6 | 0.6 | 0.4 | 0.7 |
|  | Vth (V) | 3 | 1 | 4 | 3 | 3 | 1.5 | 3 |
|  | Hysteresis | Slight | Slight | Slight | Slight | Slight | Slight | Slight |
| TFT reliability | Shift in threshold voltage Δ Vth (V) | 0.4 | 0.4 | 0.7 | 0.4 | 0.4 | 0.3 | 0.4 |
|  | Moisture resistance | ◎ | ◎ | ○ | ◎ | ◎ | ◎ | ◎ |

Example 41

An etch-stopper type field effect transistor having a bottom gate structure was fabricated and evaluated in the same manner as in Example 40, except that the first protective layer was formed of HfOx.

Examples 42 to 46

A field effect transistor having the same structure as that in Example 40 was fabricated and evaluated, except that each electrode, the first protective layer, the second protective layer and the fabrication process were change as shown in Table 9.

Example 47

Figure 6:
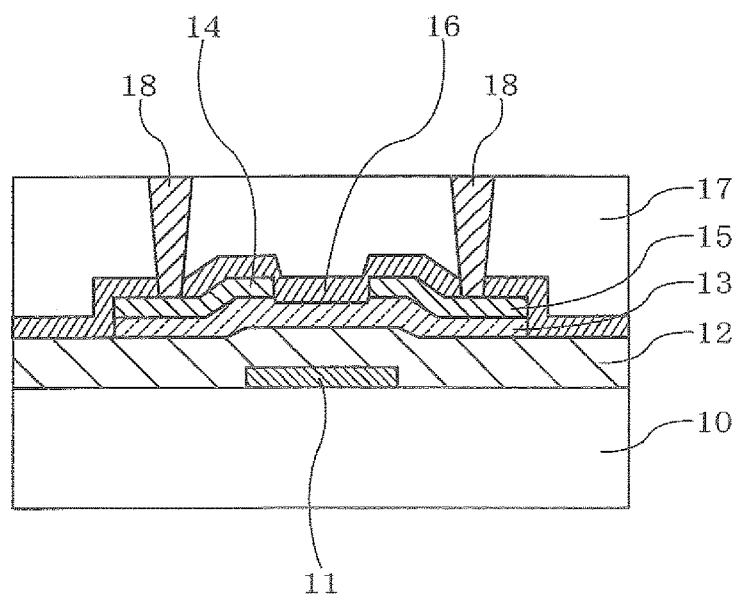
FIG. 6 is a schematic cross-sectional view of the back channel etch (BCH) type field effect transistor with a bottom gate structure fabricated in Example 47.

A back-channel-etch (BCH) type field effect transistor having a bottom gate structure shown in FIG. 6 was fabricated. The same elements as those shown in FIG. 1 are indicated by the same numerals, and an explanation thereof is omitted.

On the glass substrate 10, metal molybdenum was formed in a thickness of 200 nm by RF sputtering at room temperature, followed by patterning by wet etching to prepare the gate electrode 11.

Next, by a plasma-enhanced chemical vapor deposition (PECVD) apparatus, SiOx was formed into a film on the substrate on which the gate electrode 11 was provided, thereby to form the gate insulating film 12.

Next, the target produced in Evaluation Example 18 was mounted in a film-forming apparatus of the DC magnetron sputtering method, which is one of the DC sputtering methods, and a film was formed on the gate insulating film. The sputtering conditions were the same as those in Evaluation Example 18.

Subsequently, patterning was conducted by wet etching using an oxalic acid-based etching solution, thereby to form the semiconductor layer 13 (film thickness: 30 nm).

Subsequently, an Al—Nd alloy film was formed by DC sputtering. After the film formation, patterning was conducted by wet etching with a PAN-based etching solution to form the source electrode 14 and the drain electrode 15.

Further, SiNx was formed into a film by PECVD, thereby to form the first protective layer 16.

Then, as the second protective layer 17, SiNx was formed into a film by PECVD (PECVD SiNx:H), and the contact hole 18 was formed for the connection with an external wiring.

Thereafter, in an atmosphere, a heat treatment was conducted at 280° C. for one hour, whereby a back-channel-etch type field effect transistor with a bottom gate structure having a width (W) of 20 μm and a length (L) of 5 μm was produced.

For Example 47 and Examples 48 to 51 in which the transistors having the same shape as that in Example 47 were produced, the device structure of the field effect transistor is shown in Table 11.

Further, the results of evaluation are shown in Table 12.

TABLE 11

|  |  | Examples |  |  |  |  |
|---|---|---|---|---|---|---|
|  |  | 47 | 48 | 49 | 50 | 51 |
| Structure of TFT Film forming method | Type | Bottom gate back channel etch | Bottom gate back channel etch | Bottom gate back channel etch | Bottom gate back channel etch | Bottom gate back channel etch |
|  | Channel width W (μm) | 20 | 20 | 20 | 20 | 20 |
|  | Channle length L (μm) | 5 | 5 | 5 | 5 | 5 |
|  | Thickness of semiconductor layer | 30 | 30 | 30 | 30 | 30 |
|  | Gate insulating film | PECVD SiOx | PECVD SiOx | PECVD SiOx | PECVD SiNx | PECVD SiOx |
|  | Source/drain (S/D) electrodes | Al—Nd Alloy | Al—Nd Alloy | Al—Nd Alloy | Al—NdAlloy | Mo |
|  | First protective layer | PECVD SiOx | PECVD SiOx | PECVD SiOx | PECVD SiOx | PECVD SiOx |
|  | Second protective layer | PECVD SiNx | PECVD SiNx | PECVD SiNx | PECVD SiNx | PECVD SiNx |
| TFT production process | Kind of semiconductor layer | Evaluation Ex. 18 | Evaluation Ex. 18 | Evaluation Ex. 18 | Evaluation Ex. 18 | Evaluation Ex. 18 |
|  | Patterning Formation of semiconductor layer | Wet etching | Wet etching | Wet etching | Wet etching | Wet etching |
|  | Formation of S/D electrodes | Wet etching | Lift off | Dry etching | Wet etching | Wet etching |
|  | Conditions of heat treatment after formation of protective layer | 280° C., 1 h | 280° C., 1 h | 280° C., 1 h | 280° C., 1 h | 280° C., 1 h |

TABLE 12

|  |  | Examples |  |  |  |  |
|---|---|---|---|---|---|---|
|  |  | 47 | 48 | 49 | 50 | 51 |
| Conditions of semiconductor layer |  | Evaluation Ex. 18 | Evaluation Ex. 18 | Evaluation Ex. 18 | Evaluation Ex. 18 | Evaluation Ex. 18 |
| TFT properties | Mobility (cm$^2$/Vs) | 20 | 20 | 20 | 23 | 17 |
|  | On off ratio | $10^{10}$ | $10^{10}$ | $10^{10}$ | $10^{10}$ | $10^{10}$ |
|  | Off current (pA) | 0.01 | 0.01 | 0.01 | 0.01 | 0.01 |
|  | S value | 0.1 | 0.1 | 0.1 | 0.3 | 0.3 |

TABLE 12-continued

|  |  | Examples | | | | |
| --- | --- | --- | --- | --- | --- | --- |
|  |  | 47 | 48 | 49 | 50 | 51 |
| TFT reliability | Vth (V) | 0.1 | 0.1 | 0.1 | 0.3 | 0.5 |
|  | Hysteresis | Slight | Slight | Slight | Slight | Slight |
|  | Shift in threshold voltage Δ Vth (V) | 0.3 | 0.3 | 0.3 | 0.4 | 0.4 |
|  | Moisture resistance | ⊚ | ⊚ | ⊚ | ⊚ | ⊚ |

Examples 48 to 51

A field effect transistor having the same structure as that in Example 47 was fabricated and evaluated, except that each electrode, the first protective layer, the second protective layer and the fabrication process were changed as shown in Table 11.

Examples 52 and 53

Figure 7:
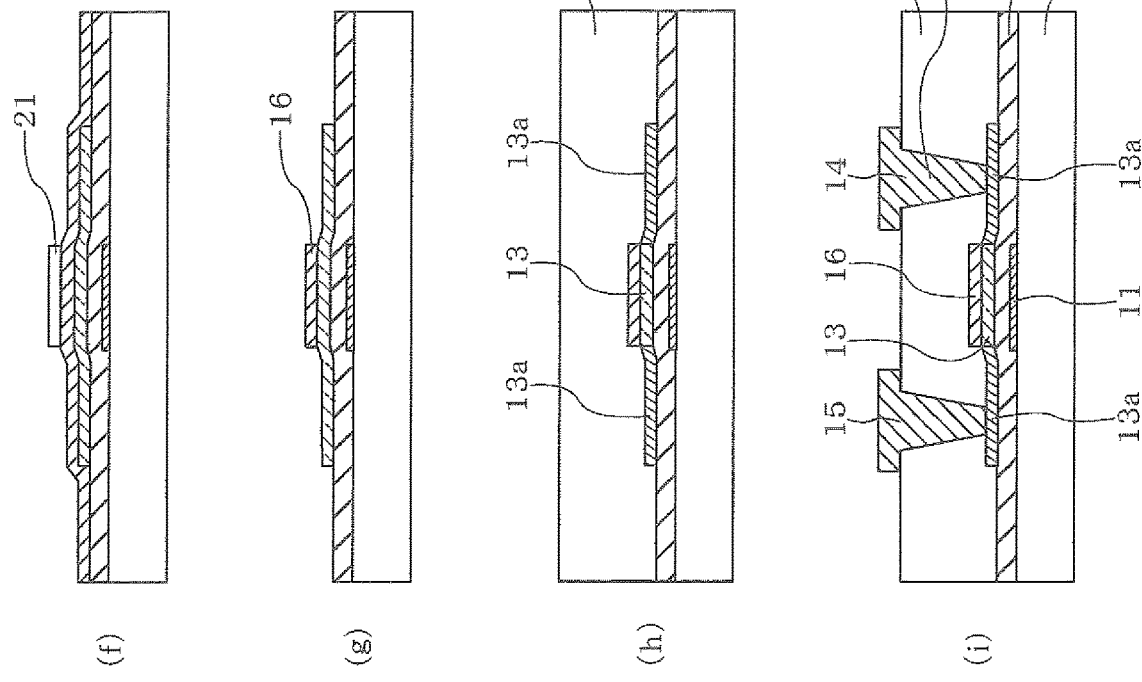
FIG. 7 a view showing the manufacturing steps of the coplanar type field effect transistor fabricated in Example 52.
Figure 7:
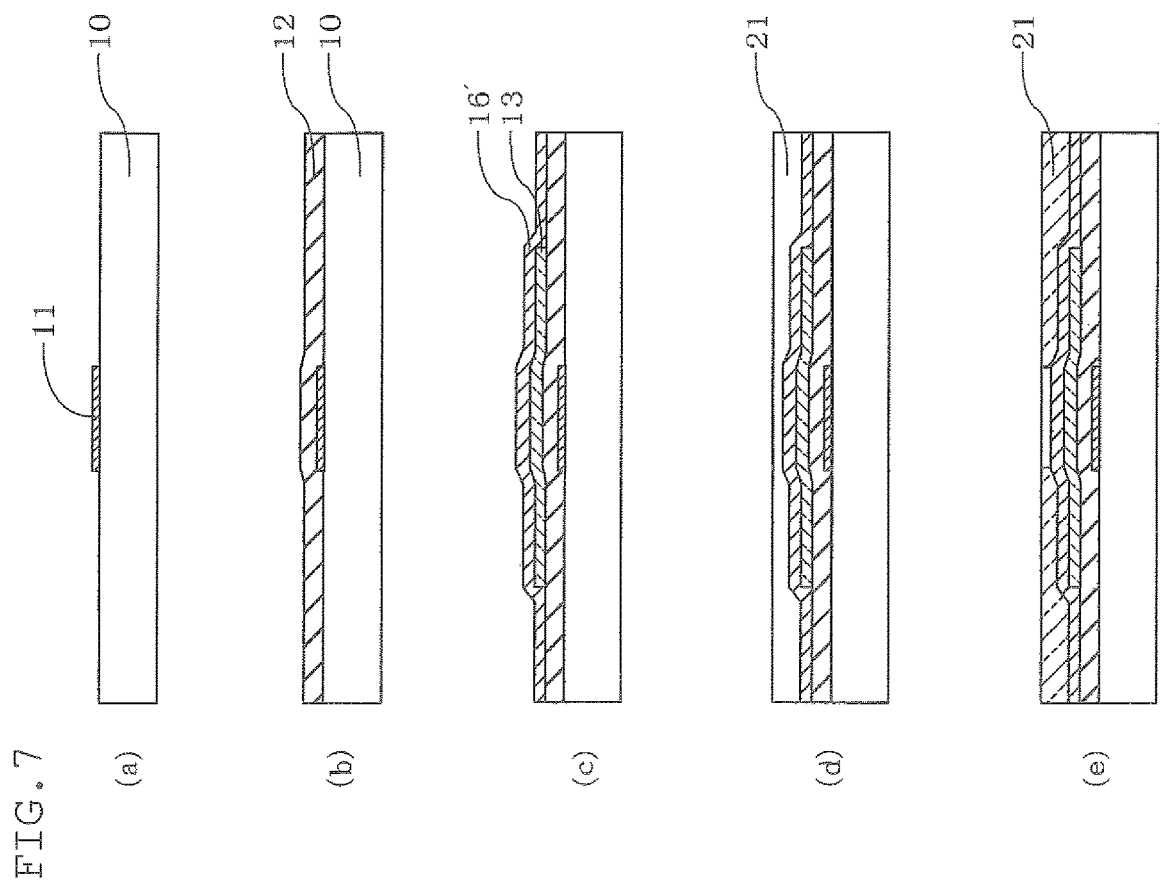

A field effect transistor with a coplaner structure shown in FIG. 7 was fabricated at the conditions shown in Table 13, and evaluated. The same elements as those in FIG. 1 are indicated by the same numerals, and an explanation thereof is omitted.

On the glass substrate 10, the gate electrode 11 and the gate insulating film 12 were formed (FIGS. 7(a)(b)). After the formation of the semiconductor layer 13, a first protective layer 16' was formed (FIG. 7(c)).

A resist film 21 was formed on the first protective layer 16' (FIG. 7(d)). Light was irradiated from the substrate 10, the gate electrode 11 was allowed to serve as a mask, and part 21' of the resist film was exposed to light and removed (FIG. 7(e)(f)). Thereafter, the first protective layer 16' was patterned such that it would be aligned with the gate electrode 11, thereby to produce the first protective layer 16 (FIG. 7(g)).

SiNx was formed into a film by PECVD (PECVD SiNx: H), thereby to form a second protective layer 17. Simultaneously with this, a part 13a of the semiconductor layer part 13 which was not covered by the first protective layer 16 was allowed to have a lower resistance, whereby the semiconductor layer part 13a with a lower resistance was formed (FIG. 7(h)). The contact holes 18 were formed to connect with the drain electrode 14 and the source electrode 15, whereby a field effect transistor with a coplaner structure was fabricated (FIG. 7(i)).

The results of evaluation are shown in Table 14.

TABLE 13

|  |  |  | Examples | | | | | | |
| --- | --- | --- | --- | --- | --- | --- | --- | --- | --- |
|  |  |  | 52 | 53 | 54 | 55 | 56 | 57 | 58 |
| Structure of TFT | Type |  | Bottom gate Coplaner | Bottom gate Coplaner | Top gate | Bottom gate Coplaner | Bottom gate etch stopper | Bottom gate etch stopper | Bottom gate etch stopper |
| Film forming method | Channel width W (μm) |  | 20 | 20 | 20 | 20 | 20 | 20 | 20 |
|  | Channle length L (μm) |  | 5 | 5 | 5 | 5 | 20 | 20 | 20 |
|  | Thickness of semiconductor layer |  | 30 | 30 | 30 | 30 | 30 | 30 | 30 |
|  | Gate insulating film |  | PECVD SiOx | RF sputtering SiOx | PECVD SiOx | PECVD SiOx | PECVD SiOx | PECVD SiOx | PECVD SiOx |
|  | Source/drain (S/D) electrodes |  | Allowing part of semiconductor layer to have a low resistance | Allowing part of semiconductor layer to have a low resistance | Al—Nd Alloy | Allowing part of semiconductor layer to have a low resistance | Al—Nd Alloy | Al—Nd Alloy | Al—Nd Alloy |
|  | First protective layer |  | PECVD SiOx | RF sputtering SiOx | PECVD SiNx | PECVD SiOx | PECVD SiOx | PECVD SiOx | PECVD SiOx |
|  | Second protective layer |  | PECVD SiNx | PECVD SiNX | None | PECVD SiNx | PECVD SiNx | PECVD SiNx | PECVD SiNx |
| TFT production process | Kind of semiconductor layer |  | Evaluation Ex. 18 | Evaluation Ex. 18 | Evaluation Ex. 18 | Evaluation Ex. 18 | Evaluation Ex. 25 | Evaluation Ex. 26 | Evaluation Ex. 27 |
|  | Patterning | Formation of semiconductor layer | Wet etching | Wet etching | Wet etching | Wet etching | Wet etching | Wet etching | Wet etching |
|  |  | Formation of S/D electrodes | Allowing part of semiconductor layer to have a low resistance | Allowing part of semiconductor layer to have a low resistance | Wet etching | Allowing part of semiconductor layer to have a low resistance | Wet etching | Wet etching | Wet etching |
|  | Conditions for heat treatment after formation of protective layer |  | 280° C., 1 h | 280° C., 1 h | 280° C., 1 h | 280° C., 1 h | 280° C., 1 h | 280° C., 1 h | 280° C., 1 h |

TABLE 14

| | | Examples | | | | | | |
|---|---|---|---|---|---|---|---|---|
| | | 52 | 53 | 54 | 55 | 56 | 57 | 58 |
| Conditions of semiconductor layer | | Evaluation Ex. 18 | Evaluation Ex. 18 | Evaluation Ex. 18 | Evaluation Ex. 18 | Evaluation Ex. 25 | Evaluation Ex. 26 | Evaluation Ex. 27 |
| TFT properties | Mobility (cm$^2$/Vs) | 25 | 18 | 16 | 25 | 33 | 32 | 30 |
| | On off ratio | $10^{10}$ | $10^{8}$ | $10^{9}$ | $10^{10}$ | $10^{10}$ | $10^{10}$ | $10^{10}$ |
| | Off current (pA) | 0.01 | 1 | 0.1 | 0.01 | 0.01 | 0.01 | 0.01 |
| | S value | 0.1 | 0.4 | 0.5 | 0.1 | 0.1 | 0.1 | 0.1 |
| | Vth (V) | 0.1 | 1.3 | 1.5 | 0.1 | 0.1 | 0.1 | 0.1 |
| | Hysteresis | Slight | Slight | Slight | Slight | Slight | Slight | Slight |
| TFT reliability | Shift in threshold voltage Δ Vth (V) | 0.3 | 0.4 | 0.8 | 0.2 | 0.1 | 0.1 | 0.1 |
| | Moisture resistance | ◎ | ◎ | ○ | ◎ | ◎ | ◎ | ◎ |

A thin film was formed on a glass substrate at the same conditions as those for the semiconductor layer and the source/drain electrodes in Example 52, and temperature characteristics of the hall effect were evaluated. The thin film which was formed at the same conditions as those for the semiconductor layer showed temperature dependency, and found to be a non-degenerative semiconductor. The thin film which was formed on the same conditions as those for the source/drain electrodes did not show temperature dependency, and found to be a degenerative semiconductor.

Figure 8:
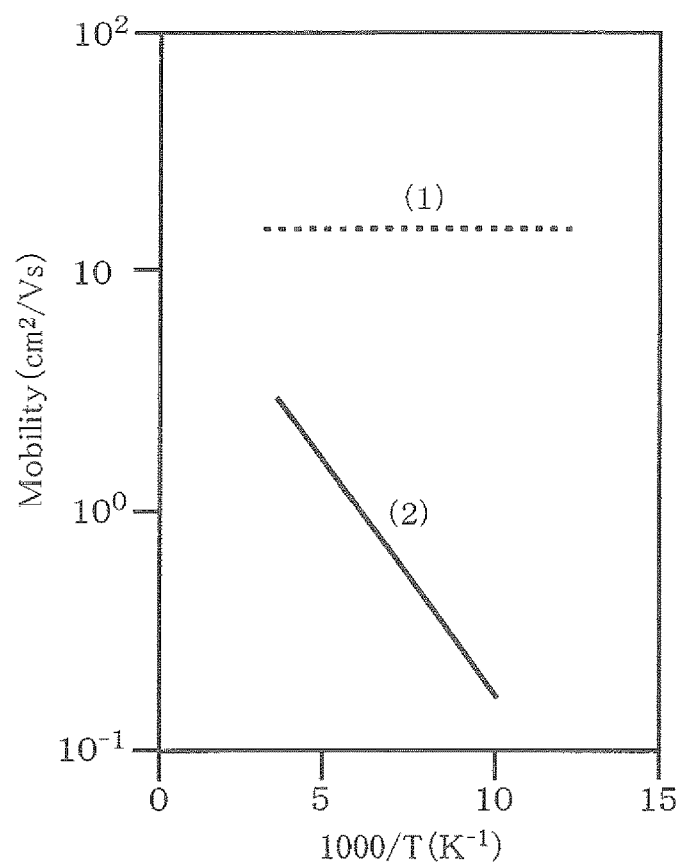
FIG. 8 is a view showing the relationship between the temperature and the mobility of an oxide semiconductor.

FIG. 8 shows temperature dependency of the mobility. Activation energy can be calculated from the gradient of the straight line. In the figure, (1) corresponds to the source/drain electrodes, and (2) corresponds to the semiconductor layer. It could be confirmed that the film corresponding to the semiconductor layer was of thermal activation type with an activation energy of about 35 meV, and was a non-degenerate semiconductor, and that the film corresponding to the source/drain electrodes was a degenerate semiconductor with an activation energy of less than 3 meV.

Example 54

Figure 9:
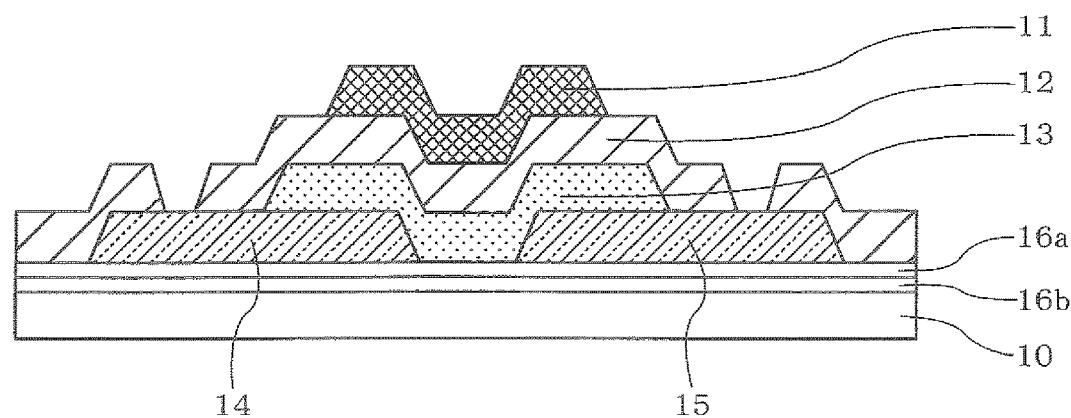
FIG. 9 is a schematic cross-sectional view of a field effect transistor with a top-gate structure fabricated in Example 54.

A field effect transistor with a top-gate structure shown in FIG. 9 was fabricated at the conditions shown in Table 13, and evaluated. The first protective layer was allowed to be a stacked structure, and formed before the formation of the semiconductor layer 13. On the side nearer to the substrate 10, a first protective layer 16b obtained by forming SiNx into a film by PECVD was formed, and thereon, a first protective layer 16a obtained by forming SiO$_2$ into a film by PECVD was formed.

The results of evaluating the transistor are shown in Table 14.

Example 55

Figure 10:
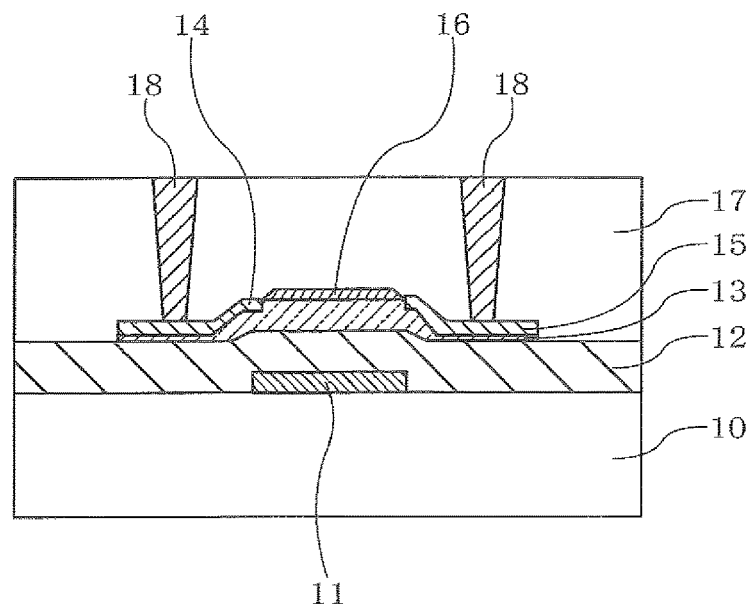
FIG. 10 is a schematic cross-sectional view of the field effect transistor fabricated in Example 55.

A field effect transistor shown in FIG. 10 was fabricated at the conditions shown in Table 13. This transistor was obtained by forming a source electrode and a drain electrode by allowing part of the semiconductor layer in the etch-stopper (ES) type field effect transistor with a bottom gate structure shown in FIG. 1.

On the glass substrate 10, metal molybdenum was formed in a thickness of 200 nm by RF sputtering at room temperature, followed by patterning by wet etching to prepare the gate electrode 11.

Next, by the plasma-enhanced chemical vapor deposition (PECVD) apparatus, SiOx was formed into a film on the substrate on which the gate electrode was provided, thereby to form the gate insulating film 12.

Next, the target produced in Evaluation Example 18 was mounted in a film-forming apparatus of the DC magnetron sputtering method, which is one of the DC sputtering methods, and a film was formed on the gate insulating film. The sputtering conditions were the same as those in Evaluation Example 18.

Subsequently, patterning was conducted with an oxalic acid-based wet etching solution, thereby to form the semiconductor layer 13 (thickness: 40 nm).

Then, SiOx was formed into a film by PECVD, followed by patterning by dry etching (RIE), thereby to form the first protective layer 16 (etch stopper).

In the above-mentioned steps, the first protective layer 16 was formed as shown in FIG. 3b(h).

Thereafter, as the second protective layer 17, SiNx was formed into a film by PECVD (PECVD SiNx:H), and at the same time, part of the semiconductor layer 13 was allowed to have a low resistance to form the source electrode 14 and the drain electrode 15. In the meantime, part of the semiconductor layer is allowed to have a low resistance due to hydrogen plasma at the time of forming SiNx into a film.

Then, the contact hole 18 was formed for the connection with an external wiring.

Thereafter, in an atmosphere, a heat treatment was conducted at 280° C. for one hour, whereby a coplanar type field effect transistor with a bottom gate structure having a width (W) of 20 μm and a length (L) of 5 μm was produced.

The evaluation results of the transistor are shown in Table 14.

Examples 56 to 58

Field effect transistors were fabricated and evaluated in the same manner as in Example 1, except that the formation of the semiconductor layer and the source/drain electrodes were changed as shown in Table 13, and the formation of the semiconductor layer and the formation of the source/drain electrodes were conducted by wet etching.

The semiconductor layer was patterned with an oxalic acid-based etching solution, and the source electrode and the drain electrode were patterned with a PAN-based etching solution.

Comparative Examples 1 to 5

Back-channel etch type field effect transistors with a bottom gate structure having a configuration shown in Table 15 were fabricated.

The semiconductor layer was formed by co-sputtering by using two types of target (ZnO and In$_2$O$_3$—SnO$_2$ (atomic ratio In:Sn=1:1).

Figure 11:
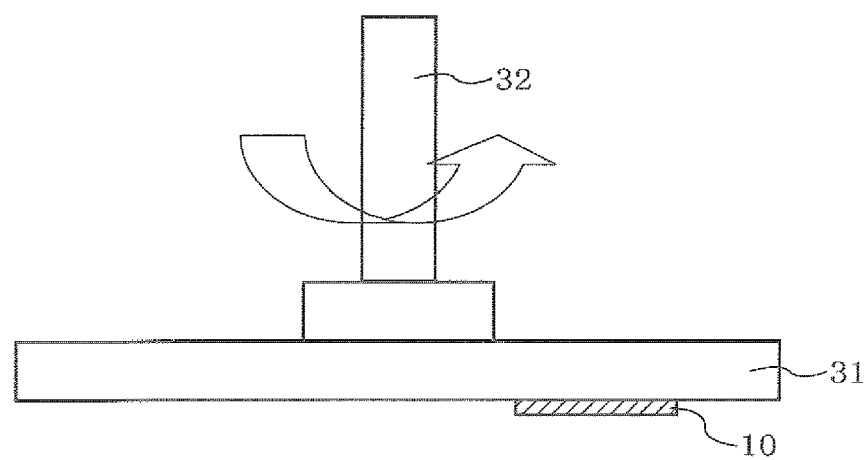
FIG. 11 is a conceptual view of thin film formation by co-sputtering.
Figure 11:

FIG. 11 is a conceptual view of film formation by co-sputtering.

The substrate 10 was fixed to a rotational table 31, and the rotational table 31 was allowed to rotate by an axis 32 during a sputtering treatment. As a result, film formation by using both the $In_2O_3$—$SnO_2$ target 33 and the ZnO target 34 could be conducted.

As for the ZnO target, film formation was conducted by RF sputtering, and as for the $In_2O_3$—$SnO_2$ target (atomic ratio In:Sn=1:1), film formation was conducted by DC sputtering.

As in the case of Example 1, the average valence numbers of Sn in Comparative Examples 1 and 5, which were measured by XPS, were +2.9 and +3.0, respectively.

The device structures of the field effect transistors fabricated in Comparative Examples are shown in Table 15. The film forming conditions, composition and properties of the semiconductor layer used in Comparative Examples are shown in Tables 16 and 17. The evaluation results of the transistors in Comparative Examples are shown in Table 18.

TABLE 15

| | | Comparative Examples | | | | | | | |
|---|---|---|---|---|---|---|---|---|---|
| | | 1-5 | 6-14 | 15 | 16 | 17 | 18 | 19 | 20 |
| TFT structure | Type | Bottom gate (Si substrate) Back channel etch | Bottom gate Etch stopper | Bottom gate Etch stopper | Bottom gate Etch stopper | Bottom gate Etch stopper | Bottom gate (Si substrate) Back channel etch | Bottom gate Etch stopper | Bottom gate Coplaner |
| Film forming method | Channel width W (μm) | 300 | 20 | 20 | 20 | 20 | 20 | 20 | 20 |
| | Channel length L (μm) | 50 | 5 | 5 | 5 | 5 | 5 | 5 | 5 |
| | Thickness of semiconductor layer (nm) | 45 | 30 | 30 | 30 | 30 | 30 | 30 | 30 |
| | Gate insulating film | Thermally oxidized film SiO$x$ | PECVD SiO$x$ | PECVD SiO$x$ | PECVD SiO$x$ | PECVD SiO$x$ | Thermally oxidized film SiO$x$ | PECVD SiO$x$ | PECVD SiO$x$ |
| | Source/drain (S/D) electrodes | Ti/Au | Ti/Al/Ti | Ti/Al/Ti | Ti/Al/Ti | Ti/Al/Ti | Al—Nd alloy | Ti/Al/Ti | Allowing part of the semiconductor layer to have a low resistance |
| | First protective layer | None | PECVD SiO$x$ | PECVD SiO$x$ | PECVD SiO$x$ | None | None | None | PECVD SiO$x$ |
| | Second protective layer | None | PECVD SiNx | None | None | None | None | None | PECVD SiNx |
| TFT fabrication process | Patterning Formation of semiconductor layer | Wet etching | Dry etching | Dry etching | Dry etching | Dry etching | Wet etching | Dry etching | Dry etching |
| | Formation of S/D electrodes | Lift off | Dry etching | Dry etching | Dry etching | Dry etching | Wet etching | Dry etching | Allowing part of the semiconductor layer to have a low resistance |
| | Heat treatment conditions | 300° C. in atmosphere | 280° C. after the formation of protective layer 1 hour | 280° C. after the formation of protective layer 1 hour | 280° C. after the formation of protective layer 1 hour | 280° C. 1 hour | 280° C. 1 hour | 280° C. 1 hour | 280° C. after the formation of protective layer 1 hour |

TABLE 16

| | | Comparative Examples | | | | | | | | | |
|---|---|---|---|---|---|---|---|---|---|---|---|
| | | 1 | 2 | 3 | 4 | 5 | 6 | 7 | 8 | 9 | 10 |
| Target atomic ratio | In/(In + Sn + Zn) | | | | | | 0.00 | 0.37 | 0.58 | 0.81 | 0.09 |
| | Sn/(In + Sn + Zn) | | | | | | 0.00 | 0.00 | 0.00 | 0.00 | 0.09 |
| | Zn/(In + Sn + Zn) | | | | | | 1.00 | 0.63 | 0.42 | 0.21 | 0.82 |
| Film forming conditions | Atmospheric gas | Ar: 100% | Ar: 100% | Ar: 100% | Ar: 100% | Ar: 100% | Ar: 97% O2: 3% | Ar: 97% O2: 3% | Ar: 97% O2: 3% | Ar: 97% O2: 3% | Ar: 97% O2: 3% |
| | Total pressure [Pa] | 1 | 1 | 1 | 1 | 1 | 0.5 | 0.5 | 0.5 | 0.5 | 0.5 |
| | Oxygen partial pressure [$\times 10^{-3}$ Pa] | 0 | 0 | 0 | 0 | 0 | 15 | 15 | 15 | 15 | 15 |
| Film composition atomic ratio | In/(In + Sn + Zn) | 0.48 | 0.43 | 0.38 | 0.34 | 0.28 | 0.00 | 0.40 | 0.60 | 0.80 | 0.10 |
| | Sn/(In + Sn + Zn) | 0.47 | 0.42 | 0.37 | 0.33 | 0.27 | 0.00 | 0.00 | 0.00 | 0.00 | 0.10 |
| | Zn/(In + Sn + Zn) | 0.05 | 0.15 | 0.25 | 0.33 | 0.45 | 1.00 | 0.60 | 0.40 | 0.20 | 0.80 |
| Thin film properties | Crystallinity (X-ray diffraction) | Amorphous | Amorphous | Amorphous | Amorphous | Amorphous | Crystal | Amorphous | Amorphous | Amorphous | Amorphous |
| | PAN resistance | ○ | ○ | ○ | ○ | ○ | X | X | X | X | ○ |

TABLE 16-continued

|  | Comparative Examples | | | | | | | | | |
|---|---|---|---|---|---|---|---|---|---|---|
|  | 1 | 2 | 3 | 4 | 5 | 6 | 7 | 8 | 9 | 10 |
| Etching properties in an oxalic acid-based etching solution | X | X | X | X | X | X | ◎ | ◎ | ◎ | X |
| Etching speed in an oxalic acid-based etching solution (nm/min) | <10 | <10 | <10 | <10 | <10 | >1000 | 350 | 200 | 100 | >1000 |
| Residue after etching with an oxalic acid-based etching solution | X | X | X | X | X | ○ | ○ | ○ | ○ | ○ |
| Suitability to dry etching | ○ | ○ | ○ | ○ | ○ | ○ | ○ | ○ | ○ | ○ |

TABLE 17

| | | Comparative Examples | | | | | | | | | |
|---|---|---|---|---|---|---|---|---|---|---|---|
| | | 11 | 12 | 13 | 14 | 15 | 16 | 17 | 18 | 19 | 20 |
| Target atomic ratio | In/(In + Sn + Zn) | 0.61 | 0.00 | 0.39 | 0.20 | 0.37 | 0.58 | 0.58 | 0.35 | 0.38 | 0.40 |
| | Sn/(In + Sn + Zn) | 0.15 | 0.39 | 0.40 | 0.75 | 0.00 | 0.00 | 0.00 | 0.15 | 0.15 | 0.39 |
| | Zn/(In + Sn + Zn) | 0.21 | 0.61 | 0.21 | 0.05 | 0.63 | 0.42 | 0.42 | 0.50 | 0.47 | 0.21 |
| Film forming conditions | Atmospheric gas | Ar: 97% O2: 3% | Ar: 97% O2: 3% | Ar: 97% O2: 3% | Ar: 97% O2: 3% | Ar: 97% O2: 3% | Ar: 97% O2: 3% | Ar: 97% O2: 3% | Ar: 97% O2: 3% | Ar: 97% O2: 3% | Ar: 97% O2: 3% |
| | Total pressure [Pa] | 0.5 | 0.5 | 0.5 | 0.5 | 0.5 | 0.5 | 0.5 | 0.5 | 0.5 | 0.5 |
| | Oxygen partial pressure [×$10^{-3}$ Pa] | 15 | 15 | 15 | 15 | 15 | 15 | 15 | 15 | 15 | 15 |
| Film composition atomic ratio | In/(In + Sn + Zn) | 0.65 | 0.00 | 0.40 | 0.20 | 0.40 | 0.60 | 0.60 | 0.37 | 0.40 | 0.40 |
| | Sn/(In + Sn + Zn) | 0.15 | 0.40 | 0.40 | 0.75 | 0.00 | 0.00 | 0.00 | 0.15 | 0.15 | 0.40 |
| | Zn/(In + Sn + Zn) | 0.20 | 0.60 | 0.20 | 0.05 | 0.60 | 0.40 | 0.40 | 0.48 | 0.45 | 0.20 |
| Thin film properties | Crystallinity (X-ray diffraction) | Amorphous | Amorphous | Amorphous | Amorphous | Amorphous | Amorphous | Amorphous | Amorphous | Amorphous | Amorphous |
| | PAN resistance | ○ | ○ | ○ | ○ | X | X | X | ○ | ○ | ○ |
| | Etching properties in an oxalic acid-based etching solution | ◎ | X | X | X | ◎ | ◎ | ◎ | ◎ | ◎ | X |
| | Etching speed in an oxalic acid-based etching solution (nm/min) | 100 | <10 | <10 | <10 | 350 | 200 | 200 | 170 | 150 | <10 |
| | Residue after etching with an oxalic acid-based etching solution | ○ | X | X | X | ○ | ○ | ○ | ○ | ○ | X |
| | Suitability to dry etching | ○ | ○ | ○ | ○ | ○ | ○ | ○ | ○ | ○ | ○ |

TABLE 18

| | | Comparative Examples | | | | | | | | | |
|---|---|---|---|---|---|---|---|---|---|---|---|
| | | 1 | 2 | 3 | 4 | 5 | 6 | 7 | 8 | 9 | 10 |
| TFT properties | Mobility (cm²/Vs) | 13 | 11 | 8 | 6 | 3 | 0.5 | 12 | 8 | 6 | 1 |
| | On off ratio | $10^7$ | $10^7$ | $10^7$ | $10^8$ | $10^8$ | $10^4$ | $10^8$ | $10^8$ | $10^6$ | $10^6$ |
| | Off current (pA) | 100 | 100 | 20 | 10 | 10 | 100 | 1 | 10 | 100 | 100 |
| | S value | 3.1 | 2.7 | 0.9 | 0.5 | 0.4 | 2.9 | 0.6 | 0.6 | 3.6 | 2.4 |
| | Vth (V) | −19 | −1.5 | 6 | 10 | 12 | −15 | 2.5 | −2 | −10 | −10 |
| | Hysteresis | Significant | Significant | Significant | Significant | Significant | Substantial | Slight | Slight | Substantial | Substantial |
| TFT reliability | Shift in threshold voltage Δ Vth (V) | 6 | 6 | 6 | 6 | 6 | 10 | 5 | 6 | 7 | 8 |
| | Moisture resistance | X | X | X | X | X | ◎ | ◎ | ◎ | ◎ | ◎ |

| | | Comparative Examples | | | | | | | | | |
|---|---|---|---|---|---|---|---|---|---|---|---|
| | | 11 | 12 | 13 | 14 | 15 | 16 | 17 | 18 | 19 | 20 |
| TFT properties | Mobility (cm²/Vs) | 6 | 2 | 3 | 0.5 | 12 | 7 | 5 | 8 | 9 | 0.5 |
| | On off ratio | $10^6$ | $10^7$ | $10^7$ | $10^4$ | $10^8$ | $10^8$ | $10^7$ | $10^7$ | $10^7$ | $10^6$ |
| | Off current (pA) | 100 | 10 | 10 | 100 | 1 | 10 | 100 | 100 | 100 | 10 |
| | S value | 3.6 | 2 | 1.1 | 4.2 | 0.6 | 0.6 | 1.2 | 1.2 | 0.8 | 0.9 |
| | Vth (V) | −10 | 6 | 3 | −25 | 2.5 | −2 | −5 | 11 | 9 | 9 |
| | Hysteresis | Substantial | Significant | Substantial | Significant | Substantial | Substantial | Substantial | Substantial | Substantial | Significant |

TABLE 18-continued

| TFT reliability | Shift in threshold voltage Δ Vth (V) | 7 | 6 | 3 | 12 | 5 | 6 | 6 | 5 | 4 | 5 |
|---|---|---|---|---|---|---|---|---|---|---|---|
| | Moisture resistance | ◎ | ◎ | ◎ | ◎ | X | X | X | Δ | Δ | ◎ |

Comparative Example 6 to 14

Field effect transistors were produced and evaluated in the same manner as in Example 1, except that the composition ratio of the semiconductor layer was changed as shown in Tables 16 and 17.

Comparative Examples 15 to 19

Field effect transistors were produced and evaluated in the same manner as in Example 1, except that the semiconductor layer was formed at the conditions as shown in Table 17 and the TFT structure and fabrication process shown in Table 15 were used.

Comparative Example 20

A field effect transistor was fabricated and evaluated in the same manner as in Example 55, except that the composition ratio was changed and the semiconductor layer was dry etched.

As a result, as compared with Comparative Example 13 which have the same composition ratio of the semiconductor layer, transistor characteristics deteriorated significantly. The reason therefor is considered to be an increase in contact resistance due to generation of a lower oxide of tin when part of the semiconductor was allowed to have a low resistance. It is considered that this occurred due to a large amount of tin and a large Sn/Zn ratio.

[Studies on Examples and Comparative Examples]
(1) Amount of Zn in the Semiconductor Layer (Zn/(In+Sn+Zn))

Figure 12:
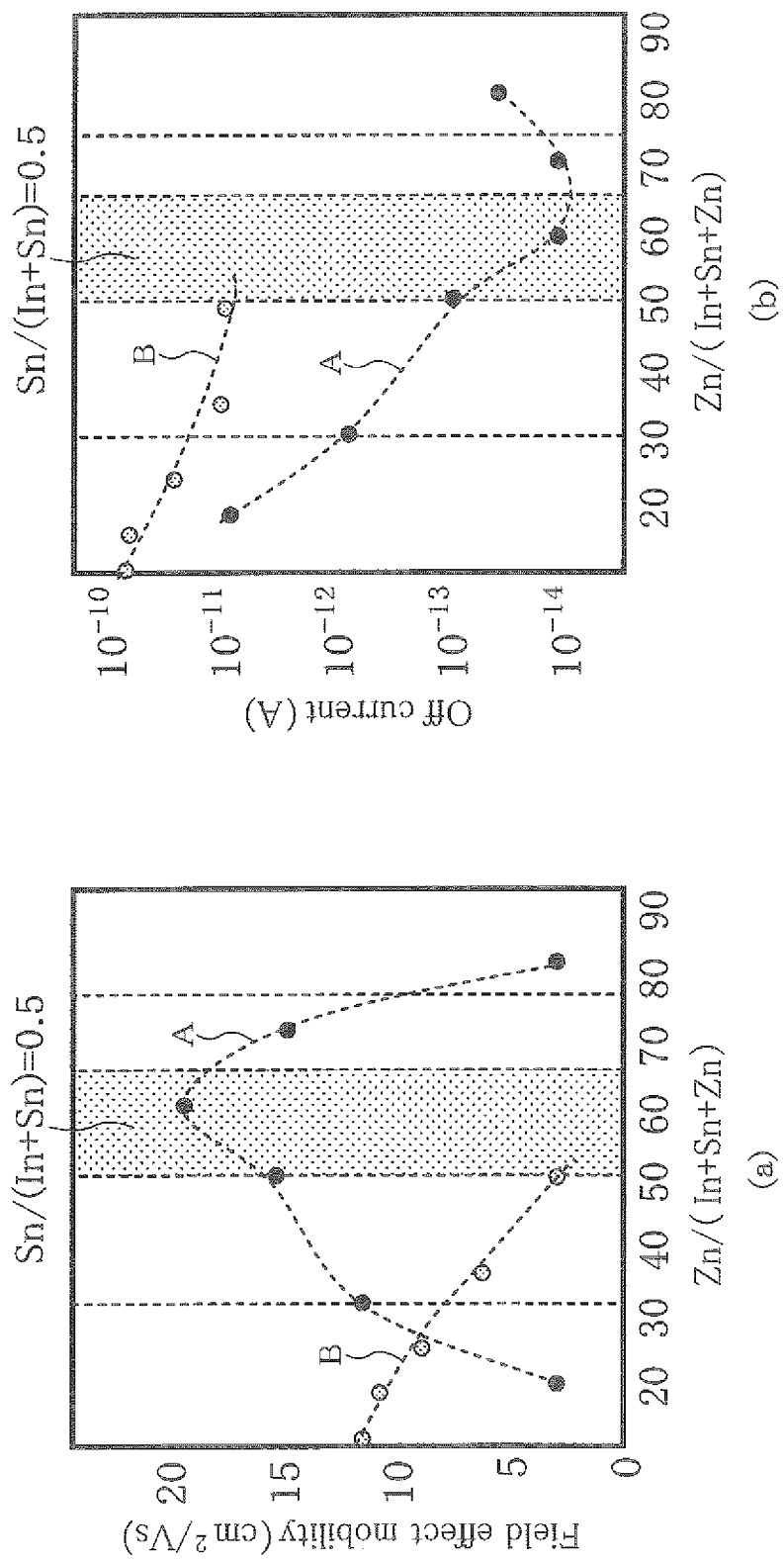
FIG. 12(a) is a view showing the relationship between the amount of Zn in the semiconductor layer and the mobility and FIG. 12(b) is a view showing the relationship between the amount of Zn in the semiconductor layer and the off current.

FIG. 12 shows the relationship between the amount of Zn with the ratio of In and Sn being fixed (Zn/(In+Sn+Zn)), the mobility (a) and the off current (b). In FIG. 12, the line based on the measured value in Examples is indicated by A, and the line based on the measured value in Comparative Examples is indicated by B.

As compared with the transistors fabricated in Comparative Examples 1 to 5 in which no protective layer was provided, in transistors which were subjected to a heat treatment after the formation of the protective layer, the mobility was not lowered even if the Zn amount was increased. The transistor showed a significantly high mobility and a low off current at around Zn/(In+Sn+Zn)=0.6. From this result, it can be understood that a highly practical TFT can be constructed by forming a protective layer.

(2) In Amount (In/(In+Sn+Zn)) or Sn Amount (Sn/(In+Sn+Zn))

Figure 13:
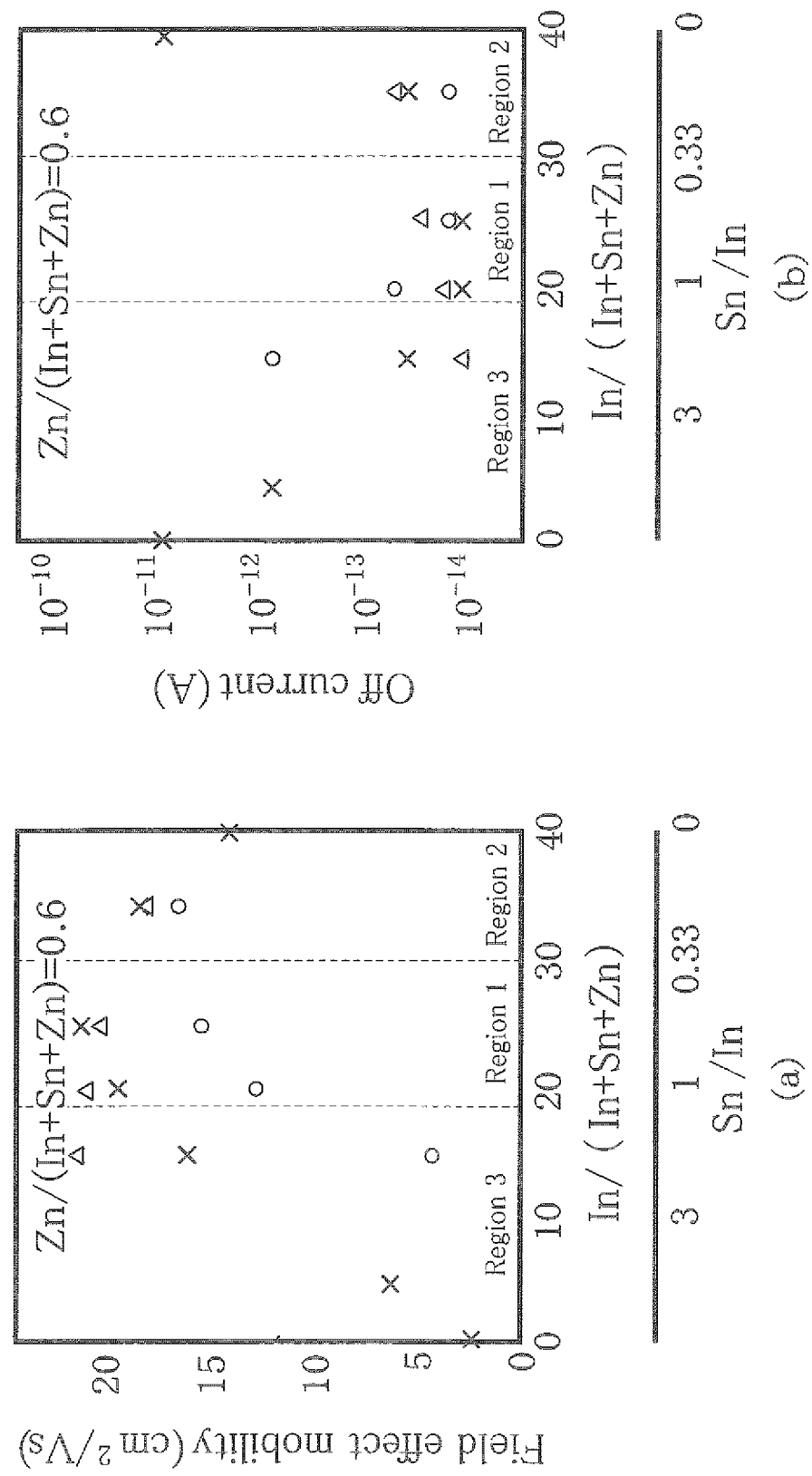
FIG. 13(a) is a view showing the relationship between the amount of In in the semiconductor layer and the mobility and FIG. 13(b) shows the relationship between the amount of In in the semiconductor layer and the off current.

FIG. 13 shows the relationship between the amount of In with the amount of Zn being fixed (In/(In+Sn+Zn)), the mobility (a) and the off current (b). FIG. 13 shows the results of comparison of the results obtained in Example 18-25 by changing the heat treatment temperature for the composition regions 1 to 3 shown in FIG. 2. When a heat treatment was conducted at 350° C., properties in the region 3 were excellent, such as a high mobility, a low off current or the like. When a heat treatment was conducted at 200° C., properties in the region 2 were excellent, such as a high mobility.

The transistor which was subjected to a heat treatment at 280° C. after the provision of the protective layer had a significantly high mobility and a low off current at an Sn/In ratio of around 0.33 to 1. From this result, it can be understood that a highly practical TFT can be constructed by forming a protective layer.

Further, as a result of comparison of the heat treatment temperature, it can be understood that, if the Sn/In ratio is small (if the Sn amount is small), good TFT characteristics can be obtained even when the heat treatment was conducted at a low temperature. The transistor can be applied to a low-temperature process with an appropriate tin amount.

(3) Protective Layer

As a result of comparing Comparative Example 18 with Example 42, due to a heat treatment after the formation of the first protective layer, effects of improvement in transistor characteristics (improvement in on-off ratio, a decrease in off current, a decrease in S value and a decrease in threshold voltage) and improvement in moisture resistance could be confirmed.

As a result of comparing Example 42 with Example 40, due to a heat treatment after the formation of the second protective layer, further improvement in moisture resistance and S value could be confirmed.

As a result of comparing Example 1 with Comparative Example 19, due to provision of the first and second protective layers, effects of improvement in transistor characteristics (improvement in on-off ratio, a decrease in off current, a decrease in S value and a decrease in threshold voltage) and improvement in moisture resistance could be confirmed.

(4) Addition of Tin Atoms

As a result of comparing Comparative Example 17 with Comparative Example 19, it could be understood that moisture resistance could be improved by the addition of tin even when no protective layer was provided.

In addition, the amount of threshold voltage shift caused by the atmospheric temperature (ΔVth (temp)) was compared between Examples 15, 12, 8 and Comparative Example 8. While the transistor in Comparative Example 8 which did not contain Sn had a ΔVth (temp) of 12V or more, the transistors in Examples 15, 12 and 8 which contained Sn had a ΔVth (temp) of 6V or less. From this comparison, it could be confirmed that stability to atmospheric temperature was improved due to the presence of Sn.

A difference in Vth between the atmospheric temperature 25° C. and the atmospheric temperature of 80° C. (Vth (25° C.)−Vth(80° C.)) was taken as the amount of a shift in threshold voltage by the atmospheric temperature (ΔVth (temp)).

(5) Oxygen Partial Pressure at the Time of Film Formation

From the results of Examples 1, 38 and 39, good characteristics could be obtained at an oxygen partial pressure in a range of from $5\times10^{-3}$ Pa to $2.5\times10^{-2}$ Pa.

(6) Characteristics on Process in the Composition Region of the Semiconductor Layer It was confirmed that the following processes could be applied to each region shown in FIG. 2. In FIG. 2, dots indicated by 0 show the composition of Examples and dots indicated by x show the composition of Comparative Examples.

Region 1: Wet etching of the semiconductor layer with oxalic acid or the like is possible, and wet etching of the source/drain electrodes with PAN or the like is possible.

Region 2: Wet etching of the semiconductor layer with oxalic acid or the like is possible.

Region 3: Wet etching of the semiconductor layer with an oxalic acid or the like is possible, and wet etching of the source/drain electrodes with PAN or the like is possible.

Region 4: Wet etching of the source/drain electrodes with PAN or the like is possible.

Outside the range: Wet etching of the source/drain electrodes with PAN or the like is possible.

Dry etching was possible in Regions 1 to 4 and outside of these regions.

(7) Target

The properties of the targets in Evaluation Examples 1, 7, 19, 25, 26 and 27 and Comparative Examples 6, 12 and 15 are shown in Table 19.

As for the targets having an atomic composition ratio of Zn/(In+Sn+Zn) of 70 atom % or less, an atomic composition ratio of In/(In Zn) of less than 33 atom % and an atomic composition ratio of Sn/(In+Sn+Zn) of 5 atom % or more and less than 15 atom % (Evaluation Example 7, 25, 26 and 27), they had a small In (indium) content and was composed mainly of a spinel-structure compound shown by $Zn_2SnO_4$, and exhibited particularly good target properties. Further, characteristics of field effect transistors fabricated using these targets were also good.

many modifications in the exemplary embodiments and/or examples are possible without materially departing from the novel teachings and advantages of this invention. Accordingly, all such modifications are intended to be included within the scope of this invention.

The documents described in the specification are incorporated herein by reference in its entirety.

The invention claimed is:

1. An amorphous semiconductor film comprising an oxide containing In atoms, Sn atoms and Zn atoms forming said semiconductor film, which film is amorphous, the atomic composition ratio of Zn/(In+Sn+Zn) being 57 atom % or more and 66 atom % or less, the atomic composition ratio of Sn/(In+Sn+Zn) being 10 atom % or more and 18 atom % or less, the atomic ratio of Sn/Zn being 0.15 or more and 0.27 or less, and an electron carrier concentration of the amorphous semiconductor film is $10^{13}$ to $10^{18}$/cm$^3$, and wherein the amorphous semiconductor film has an etching speed in PAN of less than 10 nm/min at 40° C. wherein the PAN comprises 87 wt % phosphoric acid, 3 wt % nitric acid and 10 wt % acetic acid.

2. The amorphous semiconductor film according to claim 1, wherein an average valence number, as measured using X-ray photoelectron spectroscopy (XPS), of Sn is from +3.6 to +4.0.

3. The amorphous semiconductor film according to claim 1, wherein an average valence number, as measured using X-ray photoelectron spectroscopy (XPS), of Sn is from +3.8 to +4.0.

TABLE 19

|  |  | Evaluation Examples |  |  |  |  |  | Comparative Examples |  |  |
|---|---|---|---|---|---|---|---|---|---|---|
|  |  | 1 | 7 | 19 | 25 | 26 | 27 | 6 | 12 | 15 |
| Target atomic ratio | In/(In + Sn + Zn) | 0.38 | 0.23 | 0.14 | 0.25 | 0.25 | 0.20 | 0.00 | 0.00 | 0.37 |
|  | Sn/(In + Sn + Zn) | 0.15 | 0.14 | 0.23 | 0.14 | 0.10 | 0.14 | 0.00 | 0.39 | 0.00 |
|  | Zn/(In + Sn + Zn) | 0.47 | 0.63 | 0.63 | 0.61 | 0.65 | 0.66 | 1.00 | 0.61 | 0.63 |
| Properties of target | Main component (XRD) | A bixbyite structure compound shown by In2O3 and a spinel structure compound shown by Zn2SnO4 | A spinel structure compound shown by Zn2SnO4 | A spinel structure compound shown by Zn2SnO4 | A spinel structure compound shown by Zn2SnO4 | A spinel structure compound shown by Zn2SnO4 | A spinel structure compound shown by Zn2SnO4 | A Wurtzite structure compound shown by ZnO | A spinel structure compound shown by Zn2SnO4 | A hexagonal layer compound shown by In2O3(ZnO)5 |
|  | Bulk resistance (mΩ) | 3 | 2 | 90 | 2 | 1 | 2 | 5000000 | 5000 | 9 |
|  | Relative density (%) | 99 | 99 | 93 | 99 | 99 | 99 | 78 | 81 | 97 |
|  | Transverse rupture strength (kg/mm$^2$) | 12.0 | 12.5 | 10.5 | 12.5 | 13.0 | 12.5 | 7.0 | 5.0 | 9.0 |

INDUSTRIAL APPLICABILITY

The field effect transistor of the invention can be preferably used in display panels, RFID tags, sensors such as X-ray detector panels, fingerprint sensors and photo-sensors.

Although only some exemplary embodiments and/or examples of this invention have been described in detail above, those skilled in the art will readily appreciate that 4. The amorphous semiconductor film according to claim 1, wherein an average valence number, as measured using X-ray photoelectron spectroscopy (XPS), of Sn is from +3.2 to +4.0.

5. The amorphous semiconductor film according to claim 1, wherein the atomic ratio of Sn/In is 0.41 or more and 0.69 or less.

* * * * *